US012580021B2

(12) United States Patent
Kwon et al.

(10) Patent No.: US 12,580,021 B2
(45) Date of Patent: Mar. 17, 2026

(54) BLOCK SELECTION CIRCUIT CONTROLLING SERIES CONNECTED PASS TRANSISTORS AND FLASH MEMORY INCLUDING THE SAME

(71) Applicant: SAMSUNG ELECTRONICS CO., LTD., Suwon-si (KR)

(72) Inventors: Tae-Hong Kwon, Suwon-si (KR); Gyosoo Choo, Suwon-si (KR); Myung Uk Park, Suwon-si (KR); Donggeun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 115 days.

(21) Appl. No.: 18/677,536

(22) Filed: May 29, 2024

(65) Prior Publication Data

US 2025/0095745 A1     Mar. 20, 2025

(30) Foreign Application Priority Data

Sep. 19, 2023     (KR) ........................ 10-2023-0124952

(51) Int. Cl.
| | |
|---|---|
| *G11C 16/08* | (2006.01) |
| *G11C 16/04* | (2006.01) |
| *G11C 16/16* | (2006.01) |

(52) U.S. Cl.
CPC .......... *G11C 16/08* (2013.01); *G11C 16/0483* (2013.01); *G11C 16/16* (2013.01)

(58) Field of Classification Search
CPC ..... G11C 16/08; G11C 16/0483; G11C 16/16; G11C 16/102; G11C 16/30; G11C 16/10
See application file for complete search history.

(56) References Cited

U.S. PATENT DOCUMENTS

| | | | |
|---|---|---|---|
| 5,301,144 | A | 4/1994 | Kohno |
| 8,724,391 | B2 | 5/2014 | Nakamura et al. |
| 8,971,114 | B2 | 3/2015 | Kang et al. |
| 9,293,181 | B2 | 3/2016 | Koo et al. |
| 9,721,667 | B2 | 8/2017 | Son et al. |
| 11,430,519 | B2 | 8/2022 | Passerini et al. |
| 11,475,956 | B2 | 10/2022 | Kim et al. |
| 2017/0084339 | A1 * | 3/2017 | Son ........................ G11C 16/08 |

\* cited by examiner

*Primary Examiner* — Jay W. Radke
(74) *Attorney, Agent, or Firm* — Sughrue Mion, PLLC

(57) ABSTRACT

A flash memory includes a memory block connected to word lines, an address decoder that selects one or more of the word lines, a first pass transistor connected to the address decoder, a second pass transistor connected in series with the first pass transistor and connected to one word line among the word lines, a first driver circuit that controls a gate voltage of the first pass transistor based on a first enable signal, and a second driver circuit that controls a gate voltage of the second pass transistor based on a second enable signal. Based on the memory block being an unselected memory block during an erase operation, the first driver circuit controls the first pass transistor to be in a floating state, the second driver circuit controls a power voltage to be provided to a gate of the second pass transistor.

20 Claims, 21 Drawing Sheets

Figure 1:
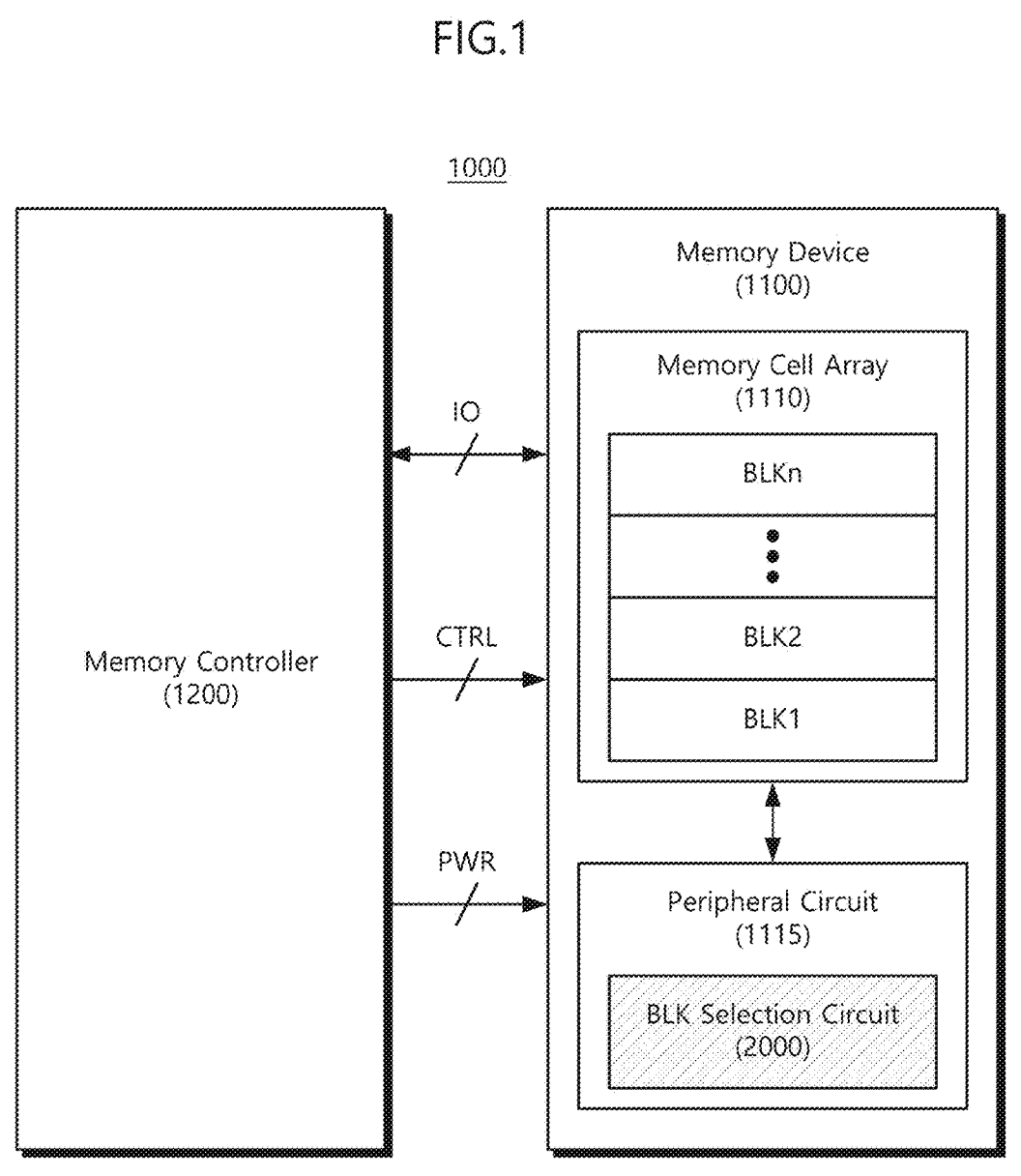

CTRL

PWR

Memory Device
(1100)

Memory Cell Array
(1110)

BLKn

● ● ●

BLK2

BLK1

Peripheral Circuit
(1115)

BLK Selection Circuit
(2000)

Memory Controller
(1200)

Figure 8:
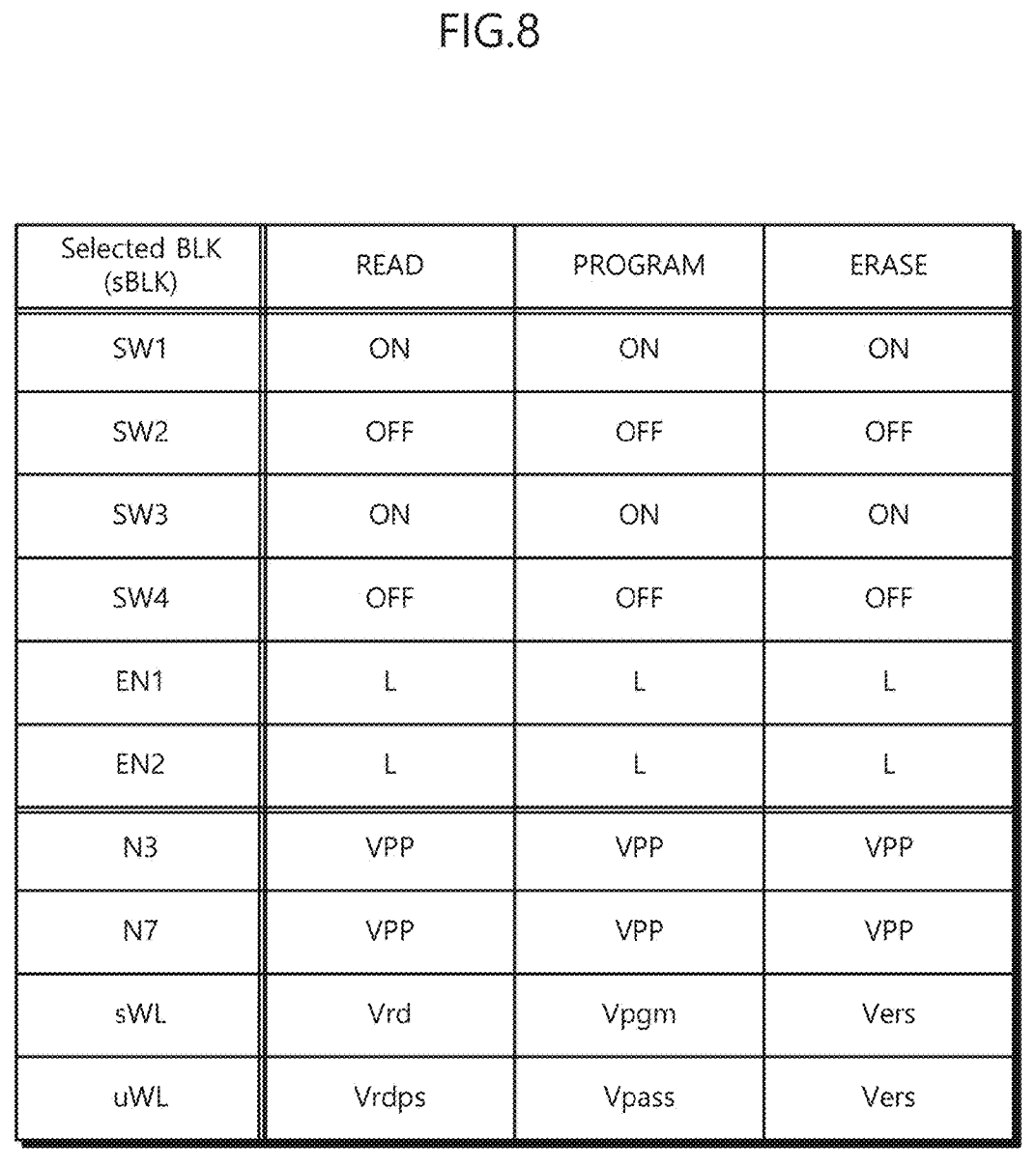

| Selected BLK (sBLK) | READ | PROGRAM | ERASE |
|---|---|---|---|
| SW1 | ON | ON | ON |
| SW2 | OFF | OFF | OFF |
| SW3 | ON | ON | ON |
| SW4 | OFF | OFF | OFF |
| EN1 | L | L | L |
| EN2 | L | L | L |
| N3 | VPP | VPP | VPP |
| N7 | VPP | VPP | VPP |
| sWL | Vrd | Vpgm | Vers |
| uWL | Vrdps | Vpass | Vers |

FIG.11

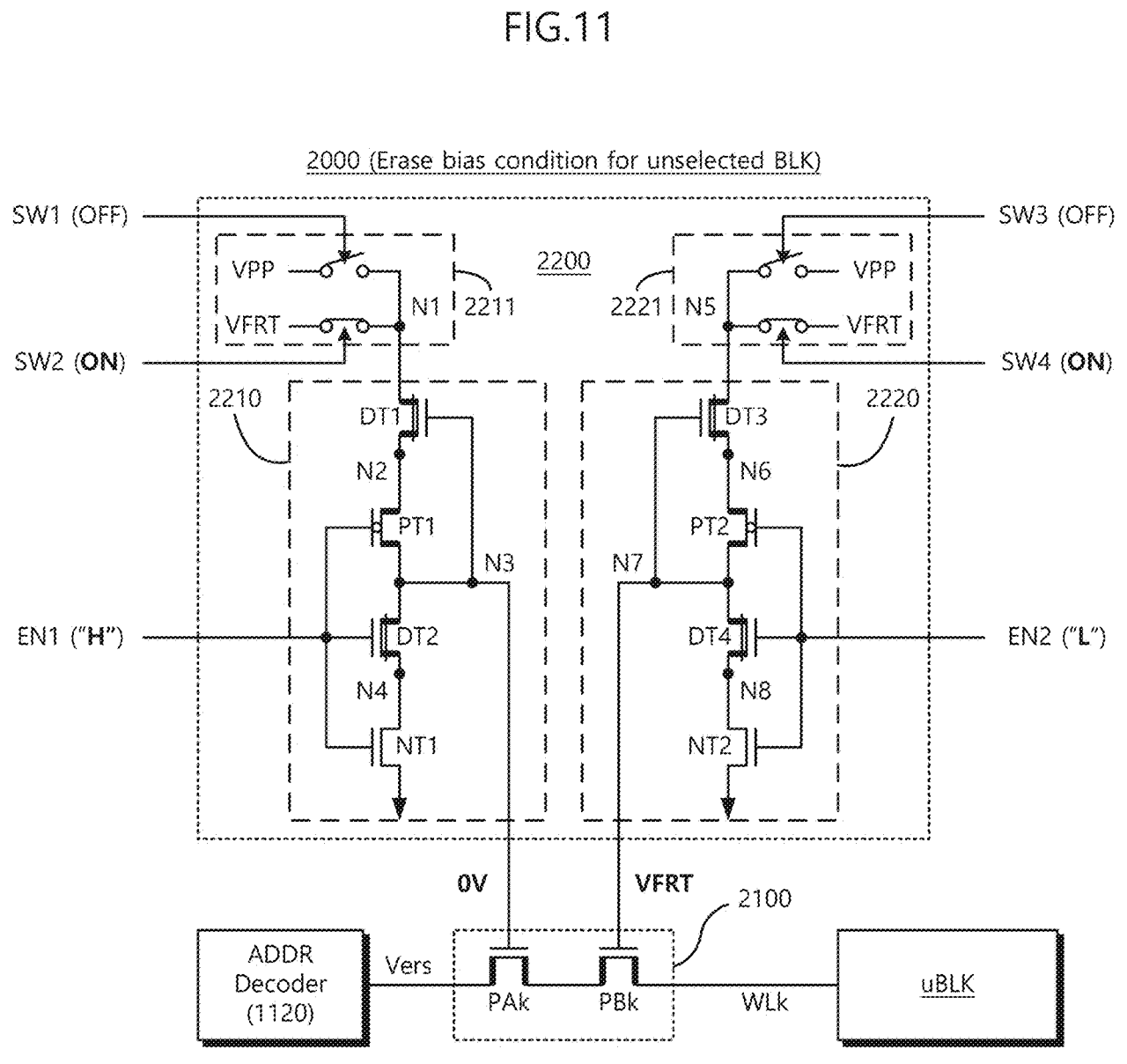

2000 (Erase bias condition for unselected BLK)

SW3 (OFF)

SW4 (ON)

EN2 ("L")

VPP

VFRT

2220

DT3

N6

PT2

DT4

N8

NT2

N5

2221

N7

2200

2210

2211

N1

VPP

VFRT

DT1

N2

PT1

DT2

N4

NT1

N3

SW1 (OFF)

SW2 (ON)

EN1 ("H")

uBLK

WLk

VFRT

2100

PBk

0V

PAk

Vers

ADDR
Decoder
(1120)

FIG.13

| Unselected BLK (uBLK) | READ | PROGRAM | ERASE |
|---|---|---|---|
| SW1 | OFF | OFF | OFF |
| SW2 | ON | ON | ON |
| SW3 | OFF | OFF | OFF |
| SW4 | ON | ON | ON |
| EN1 | H | L | H |
| EN2 | H | H | L |
| N3 | L | VFRT | L |
| N7 | L | L | L |
| WLk | Floating | Floating | VFRT |
| | | | Coupling |

FIG.18

| OPQR | fPGM (fERS) | OR | NOR |
|------|-------------|-----|-----|
| L | L | L | H |
| H | L | H | L |
| L | H | H | L |
| H | H | H | L |

FIG.19

| | sBLK | | | uBLK | | |
| --- | --- | --- | --- | --- | --- | --- |
| | READ | PROGRAM | ERASE | READ | PROGRAM | ERASE |
| OPQR | H | H | H | L | L | L |
| fPGM | L | H | L | L | H | L |
| fERS | L | L | H | L | L | H |
| EN1 | L | L | L | H | L | H |
| EN2 | L | L | L | H | H | L |
| PA_Gate | VPP | VPP | VPP | 0 | VFRT | 0 |
| PB_Gate | VPP | VPP | VPP | 0 | 0 | VFRT |

BLOCK SELECTION CIRCUIT CONTROLLING SERIES CONNECTED PASS TRANSISTORS AND FLASH MEMORY INCLUDING THE SAME

CROSS-REFERENCE TO RELATED APPLICATIONS

This application claims priority under 35 U.S.C. § 119 to Korean Patent Application No. 10-2023-0124952 filed on Sep. 19, 2023, in the Korean Intellectual Property Office, the disclosure of which being incorporated by reference herein in its entirety.

BACKGROUND

Apparatuses and devices consistent with the present disclosure relate to a semiconductor memory device, and more particularly, to a block selection circuit that controls pass transistors connected in series and a flash memory including the same.

A semiconductor memory may be mainly classified as a volatile memory or a non-volatile memory. Read and write speeds of the volatile memory (e.g., a DRAM or an SRAM) are fast, but the data stored in the volatile memory disappear when a power is turned off. In contrast, the non-volatile memory may retain data even when the power is turned off.

A representative example of the non-volatile memory is a flash memory. The flash memory may store multi-bit data of two or more bits in one memory cell. The flash memory that stores the multi-bit data may have one erase state and a plurality of program states depending on threshold voltage distributions.

The flash memory may select memory blocks during operation. However, related art block selection technologies may be vulnerable to high voltages such as a program voltage or an erase body voltage applied during a program operation or an erase operation, thus requiring a larger flash memory that is more durable at high voltages.

SUMMARY

It is an aspect to provide a block selection circuit that has a pass transistor structure that is durable against high voltage and may reduce the overall area of the block selection circuit, and a flash memory including the same.

According to an aspect of one or more embodiments, there is provided a flash memory comprising a memory block connected to a plurality of word lines; an address decoder configured to select one or more of the plurality of word lines; a first pass transistor connected to the address decoder; a second pass transistor connected in series with the first pass transistor and connected to one word line among the plurality of word lines; a first driver circuit configured to control a gate voltage of the first pass transistor based on a first enable signal; and a second driver circuit for controlling a gate voltage of the second pass transistor based on a second enable signal, wherein based on the memory block being an unselected memory block during an erase operation, the first driver circuit controls the first pass transistor to be in a floating state, the second driver circuit controls a power voltage to be provided to a gate of the second pass transistor.

According to another aspect of one or more embodiments, there is provided a flash memory comprising a memory block connected to a plurality of word lines; an address decoder configured to select the memory block using a block address; a first pass transistor connected to the address decoder; a second pass transistor connected in series with the first pass transistor and connected to a word line among the plurality of word lines; a first driver circuit configured to control a gate voltage of the first pass transistor based on a first enable signal; a second driver circuit configured to control a gate voltage of the second pass transistor based on a second enable signal; a first switch circuit configured to selectively provide a first power voltage or a second power voltage to a gate of the first pass transistor through the first driver circuit based on a first switch signal; and a second switch circuit configured to selectively provide the first power voltage or the second power voltage to a gate of the second pass transistor through the second driver circuit based on a second switch signal. The first switch circuit is used individually for the memory block, and the second switch circuit is shared by the memory block and other memory blocks.

According to yet another aspect of one or more embodiments, there is provided a block selection circuit of a flash memory, the block selection circuit comprising a first pass transistor connected to an address decoder; a second pass transistor connected in series with the first pass transistor; a first driver circuit configured to control a gate voltage of the first pass transistor based on a first enable signal; and a second driver circuit configured to control a gate voltage of the second pass transistor based on a second enable signal. Based on a memory block connected to the second pass transistor during an erase operation being an unselected memory block, the first driver circuit controls the first pass transistor to be in a floating state, and the second driver circuit controls a power voltage to be provided to a gate of the second pass transistor.

BRIEF DESCRIPTION OF THE FIGURES

The above and other aspects will become apparent by describing in detail embodiments thereof with reference to the accompanying drawings, in which:

FIG. 1 is a block diagram illustrating a storage device according to some embodiments;

FIGS. 7 and 8 are respectively a circuit diagram and a table illustrating bias conditions of the block selection circuit shown in FIG. 6, according to some embodiments;

FIGS. 9 to 12 are circuit diagrams illustrating bias conditions for an unselected memory block shown in FIG. 6, according to some embodiments;

FIG. 13 is a table illustrating bias conditions for the unselected memory block illustrated in FIG. 6, according to some embodiments;

FIGS. 17 to 19 are circuit diagram and tables illustrating a method of generating switch signals and enable signals in the memory device illustrated in FIG. 2, according to some embodiments;

DETAILED DESCRIPTION

Figure 2:
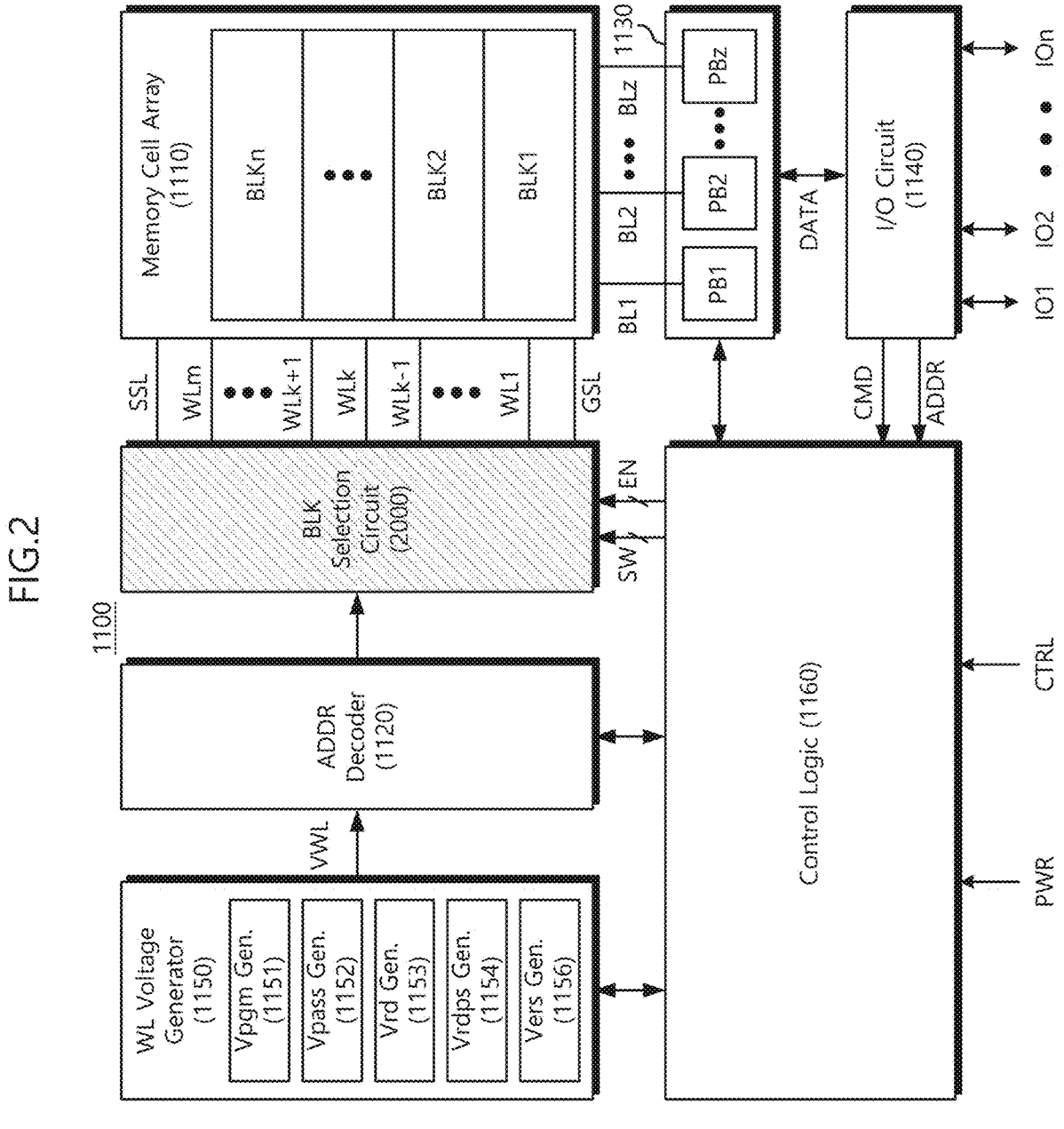
FIG. 2 is a block diagram illustrating a memory device of the storage device illustrated in FIG. 1, according to some embodiments.

A non-volatile memory such as a flash memory may include a plurality of memory blocks. Each memory block may include a plurality of pages. The flash memory may perform an erase operation on a memory block basis and a read or program operation on a page basis. Each memory block may be connected to a block selection circuit through a plurality of word lines. The block selection circuit may include a pass transistor connected to each word line and a driver circuit for driving the pass transistor.

Since the related art block selection circuit consists of one pass transistor for each word line, the related art block selection circuit is vulnerable to high voltages such as a program voltage or an erase body voltage applied during a program operation or an erase operation. Therefore, the flash memory must be enlarged in size to manufacture pass transistors that are durable at high voltages.

Various embodiments provide a block selection circuit that has a pass transistor structure that is durable against high voltage and may reduce the overall area of the block selection circuit, and a flash memory including the block selection circuit.

Below, example embodiments will be described in detail and clearly to such an extent that an ordinary one in the art easily implements the embodiments.

FIG. 1 is a block diagram illustrating a storage device according to some embodiments. A storage device 1000 may be a flash storage device based on a flash memory. For example, the storage device 1000 may be implemented as a solid-state drive (SSD), a universal flash storage (UFS), a memory card, or the like.

Referring to FIG. 1, the storage device 1000 may include a memory device 1100 and a memory controller 1200. The memory device 1100 may receive input/output signals IO from the memory controller 1200 through input/output lines, receive control signals CTRL through control lines, and receive external power supply PWR through power lines. The storage device 1000 may store data in the memory device 1100 under the control of the memory controller 1200.

The memory device 1100 may be a flash memory and may include a memory cell array 1110 and a peripheral circuit 1115. The memory cell array 1110 may include a plurality of memory blocks BLK1 to BLKn. Each memory block may have a vertical 3D structure. Each memory block may include a plurality of memory cells. Multi-bit data may be stored in each memory cell.

The memory cell array 1110 may be located (e.g., disposed) next to or above the peripheral circuit 1115 in terms of a layout structure. A structure in which the memory cell array 1110 is positioned over the peripheral circuit 1115 may be referred to as a cell on peripheral (COP) structure.

In an example embodiment, the memory cell array 1110 may be manufactured as a chip separate from the peripheral circuit 1115. An upper chip including the memory cell array 1110 and a lower chip including the peripheral circuit 1115 may be connected to each other by a bonding method. Such a structure may be referred to as a chip-to-chip (C2C) structure.

The peripheral circuit 1115 may include analog circuits and/or digital circuits to store data in the memory cell array 1110 or read data stored in the memory cell array 1110. The peripheral circuit 1115 may receive the external power PWR through power lines and generate internal powers of various levels.

The peripheral circuit 1115 may receive commands, addresses, and/or data from the memory controller 1200 through input/output lines. The peripheral circuit 1115 may store data in the memory cell array 1110 according to the control signals CTRL. In some embodiments, the peripheral circuit 1115 may read data stored in the memory cell array 1110 and provide the read data to the memory controller 1200.

The peripheral circuit 1115 may include a block (BLK) selection circuit 2000. The block selection circuit 2000 may include two or more pass transistors connected in series to one word line. Hereinafter, a structure in which two or more pass transistors are connected in series is referred to as a series connected pass transistor.

The memory device 1100 according to example embodiments may enhance high voltage durability during program or erase operations by using a series connected pass transistor. The memory device 1100 may distribute the influence of a high voltage applied to one pass transistor, as in the related art, to two pass transistors. Therefore, the size of individual pass transistors may be reduced.

FIG. 2 is a block diagram illustrating the memory device 1100 of the storage device 1000 illustrated in FIG. 1, according to some embodiments. Referring to FIG. 2, the memory device 1100 may include the memory cell array 1110 and the peripheral circuit 1115 (see FIG. 1). The peripheral circuit 1115 may include the block selection circuit 2000, an address (ADDR) decoder 1120, a page buffer circuit 1130, an input/output (I/O) circuit 1140, a word line (WL) voltage generator 1150, and a control logic 1160.

As described above, the memory cell array 1110 may include the plurality of memory blocks BLK1 to BLKn. Each memory block may be include a plurality of pages. Each page may include a plurality of memory cells. Each memory cell may store multi-bit data (e.g., two or more bits). Each memory block may correspond to an erase unit, and each page may correspond to a read and/or write unit.

The memory cell array 1110 may be formed in a direction perpendicular to a substrate. A gate electrode layer and an insulation layer may be alternately deposited on the substrate. Each memory block (e.g., BLK1) may be connected to one or more string selection lines SSL, a plurality of word lines WL1 to WLm, and one or more ground selection lines GSL. In the example illustrated in FIG. 2, WLk is a selected word line sWL and the remaining word lines (WL1 to WLk−1, WLk+1 to WLm) are unselected word lines uWL for convenience of description.

The address (ADDR) decoder 1120 may be connected to the memory cell array 1110 through the string and ground selection lines SSL and GSL and word lines WL1 to WLm. The address decoder 1120 may select a word line during a program or read operation. The address decoder 1120 may receive a word line voltage VWL from the word line (WL) voltage generator 1150 and provide a program voltage or read voltage to the selected word line.

The page buffer circuit 1130 may be connected to the memory cell array 1110 through bit lines BL1 to BLz. The page buffer circuit 1130 may temporarily store data to be stored in the memory cell array 1110 or data read from the memory cell array 1110. The page buffer circuit 1130 may include a plurality of page buffers PB1 to PBz connected to respective bit lines. Each page buffer may include a plurality of latches to store or read multi-bit data.

The input/output (I/O) circuit 1140 may be internally connected to the page buffer circuit 1130 through data lines DATA and externally connected to the memory controller 1200 (refer to FIG. 1) through a plurality of input/output lines IO1 to IOn. The input/output circuit 1140 may receive program data from the memory controller 1200 during a program operation. The input/output circuit 1140 may provide data read from the memory cell array 1110 to the memory controller 1200 during a read operation.

The word line (WL) voltage generator 1150 may receive internal power from the control logic 1160 and generate the word line voltage VWL to read or write data. The word line voltage VWL may be provided to a selected word line (sWL) or unselected word lines (uWL) through the address decoder 1120.

The word line (WL) voltage generator 1150 may include a program voltage (Vpgm) generator 1151 and a pass voltage (Vpass) generator 1152. The program voltage generator 1151 may generate a program voltage Vpgm provided to the selected word line sWL during a program operation. The pass voltage generator 1152 may generate a pass voltage Vpass provided to the selected word line sWL and the unselected word lines uWL.

The word line (WL) voltage generator 1150 may include a read voltage (Vrd) generator 1153, a read pass voltage (Vrdps) generator 1154, and an erase voltage (Vers) generator 1156. The read voltage generator 1153 may generate a select read voltage Vrd provided to the select word line sWL during a read operation. The read pass voltage generator 1154 may generate a read pass voltage Vrdps provided to unselected word lines uWL. The read pass voltage Vrdps may be a voltage sufficient to turn on memory cells connected to the unselected word lines uWL during a read operation.

The control logic 1160 may control operations such as read, write, and erase of the memory device 1100 using commands CMD, addresses ADDR, and control signals CTRL provided from the memory controller 1200. The addresses ADDR may include a block selection address for selecting one memory block, a row address for selecting one page, and/or a column address for selecting one memory cell.

The block selection circuit 2000 may be connected between the memory cell array 1110 and the address decoder 1120. The block selection circuit 2000 may include pass transistors, each connected in series to one corresponding word line. The block selection circuit 2000 may effectively protect the series connected pass transistor from the program voltage Vpgm applied during a program operation or the erase voltage Vers applied during an erase operation. The block selection circuit 2000 may include a pass transistor driver circuit for driving series connected pass transistors. The pass transistor driver circuit may individually control series connected pass transistors.

The control logic 1160 may provide switch signals SW and enable signals EN to control the pass transistor driver circuit of the block selection circuit 2000. The switch signals SW and enable signals EN may be generated using an address ADDR and command CMD. For example, in some embodiments, the control logic 1160 may generate switch signals SW using a block address. In some embodiments, the control logic 1160 may generate enable signals EN during a program operation using a block address and a program start signal. In some embodiments, the control logic 1160 may generate enable signals EN during an erase operation using the block address and an erase start signal.

Figure 3:
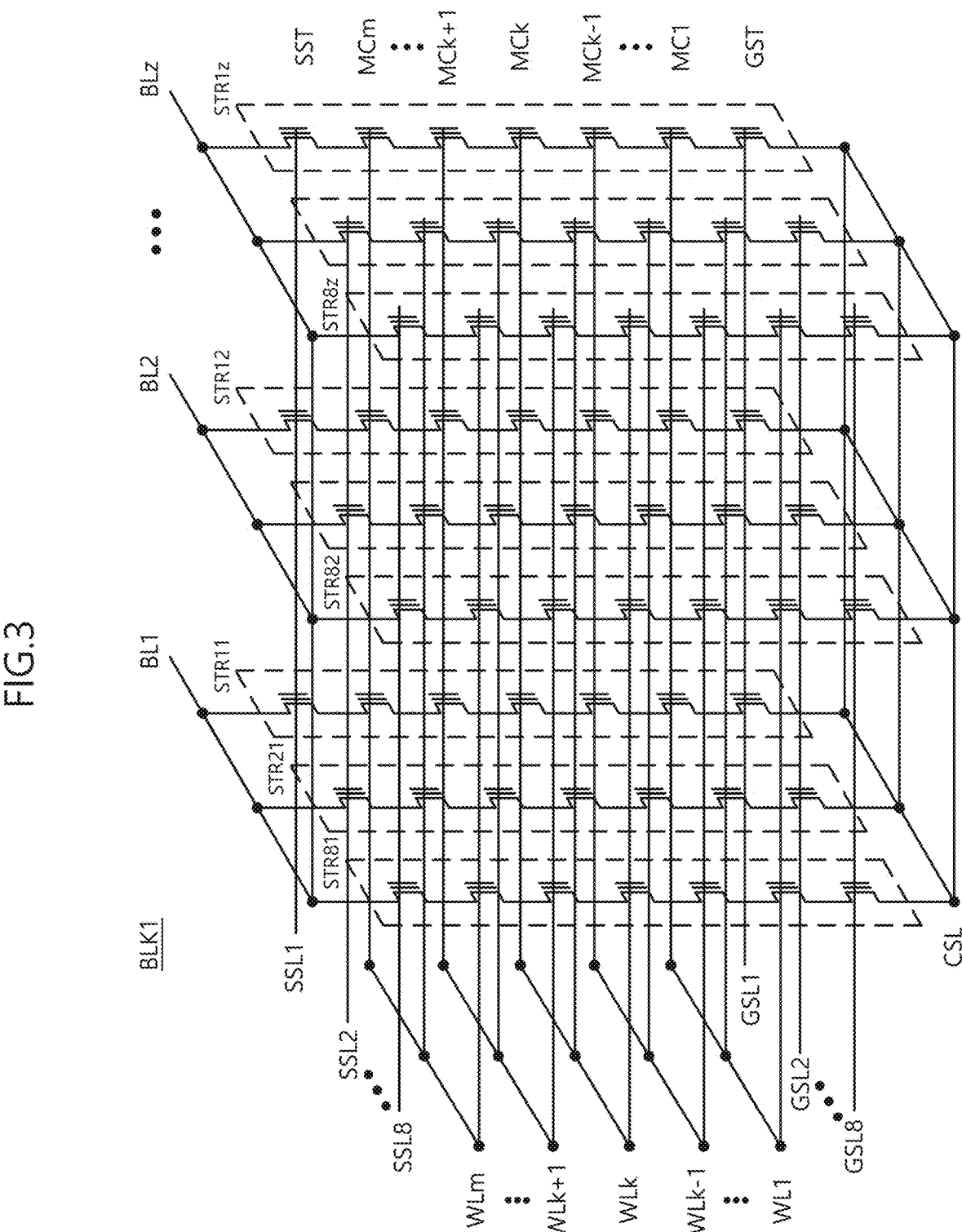
FIG. 3 is a circuit diagram illustrating a memory block BLK1 of a memory cell array of the memory device illustrated in FIG. 2, according to some embodiments.

FIG. 3 is a circuit diagram illustrating an example of a memory block BLK1 of the memory cell array 1110 illustrated in FIG. 2, according to some embodiments. Referring to FIG. 3, in the memory block BLK1, a plurality of cell strings STR11 to STR8z may be formed between the bit lines BL1 to BLz and a common source line CSL. Each cell string includes a string selection transistor SST, a plurality of memory cells MC1 to MCm, and a ground selection transistor GST.

The string selection transistors SST may be connected with string selection lines SSL1 to SSL8. The ground selection transistors GST may be connected with ground selection lines GSL1 to GSL8. The string selection transistors SST may be connected with the bit lines BL1 to BLz, and the ground selection transistors GST may be connected with the common source line CSL.

The first to m-th word lines WL1 to WLm may be connected with the plurality of memory cells MC1 to MCm in a row direction. The first to z-th bit lines BL1 to BLz may be connected with the plurality of memory cells MC1 to MCm in a column direction. The first to z-th page buffers PB1 to PBz may be connected with the first to z-th bit lines BL1 to BLz.

The first word line WL1 may be placed above the first to eighth ground selection lines GSL1 to GSL8. The first memory cells MC1 that are placed at the same height from the substrate may be connected with the first word line WL1. The m-th word line WLm may be located below the first to eighth string selection lines SSL1 to SSL8. The m-th memory cells MCm located at the same height from the substrate may be connected to the m-th word line WLm. In a similar manner, the second to (m−1)-th memory cells MC2 to MCm−1 that are placed at the same heights from the substrate may be respectively connected with the second to (m−1)-th word lines WL2 to WLm−1, respectively.

Figure 4:
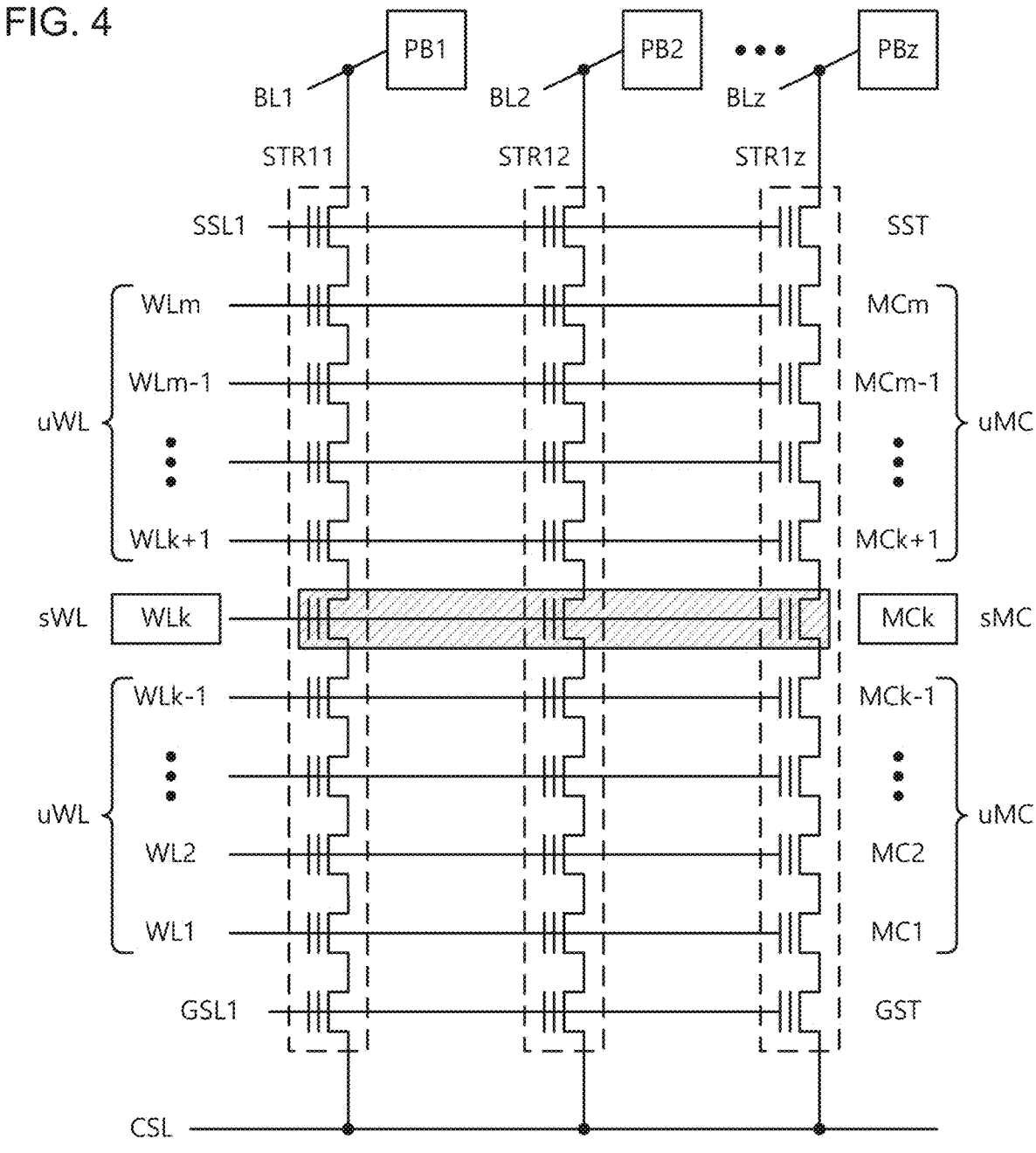
FIG. 4 is a circuit diagram illustrating cell strings selected by a first string selection line SSL1 from among cell strings of the memory block BLK1 illustrated in FIG. 3, according to some embodiments.

FIG. 4 is a circuit diagram illustrating cell strings selected by the first string selection line SSL1 from among the cell strings of the memory block BLK1 illustrated in FIG. 3, according to some embodiments. The eleventh to 1z cell strings STR11 to STR1z may be selected by the first string selection line SSL1. The eleventh to 1z cell strings STR11 to STR1z may be connected to the first to z-th bit lines BL1 to BLz, respectively. The first to z-th page buffers PB1 to PBz may be connected to the first to z-th bit lines BL1 to BLz, respectively.

The eleventh cell string STR11 may be connected to the first bit line BL1 and the common source line CSL. The eleventh cell string STR11 may include string selection transistors SST selected by the first string selection line SSL1, first to m-th memory cells MC1 to MCm connected to the first to m-th word lines WL1 to WLm, and ground selection transistors GST selected by the first ground selection line GSL1. The twelfth cell string STR12 may be connected to the second bit line BL2 and the common source line CSL. The 1z cell string STR1z may be connected to the z-th bit line BLz and the common source line CSL.

The first word line WL1 and the m-th word line WLm may be edge word lines (edge WL). The second word line WL2 and the (m−1)-th word line WLm−1 may be edge adjacent word lines. The k-th word line WLk may be a selected word line sWL. The (k−1)-th word line WLk−1 and the (k+1)-th word line WLk+1 may be adjacent word lines adjacent to the selected word line. If the k-th word line WLk is the selected word line sWL, the remaining word lines WL1 to WLk−1 and WLk+1 to WLm may be unselected word lines uWL.

The first memory cells MC1 and the m-th memory cells MCm may be edge memory cells. The second memory cells MC2 and the (m−1)-th memory cells MCm−1 may be edge adjacent memory cells. The k-th memory cells MCk may be selected memory cells sMC. The (k−1)-th memory cells MCk−1 and the (k+1)-th memory cells MCk+1 may be memory cells adjacent to the selected memory cells (adjacent MC). If the k-th memory cells MCk are selected memory cells sMC, the remaining memory cells MC1 to MCk−1 and MCk+1 to MCm may be unselected memory cells uMC.

A set of memory cells selected by one string selection line and connected to one word line may be one page. For example, memory cells selected by the first string selection line SSL1 and connected to the k-th word line WLk may be one page. For example, eight pages may be configured on the k-th word line WLk. Among the eight pages, a page connected to the first string selection line SSL1 is a selected page, and pages connected to the second to eighth string selection lines SSL2 to SSL8 are unselected pages.

Figure 5:
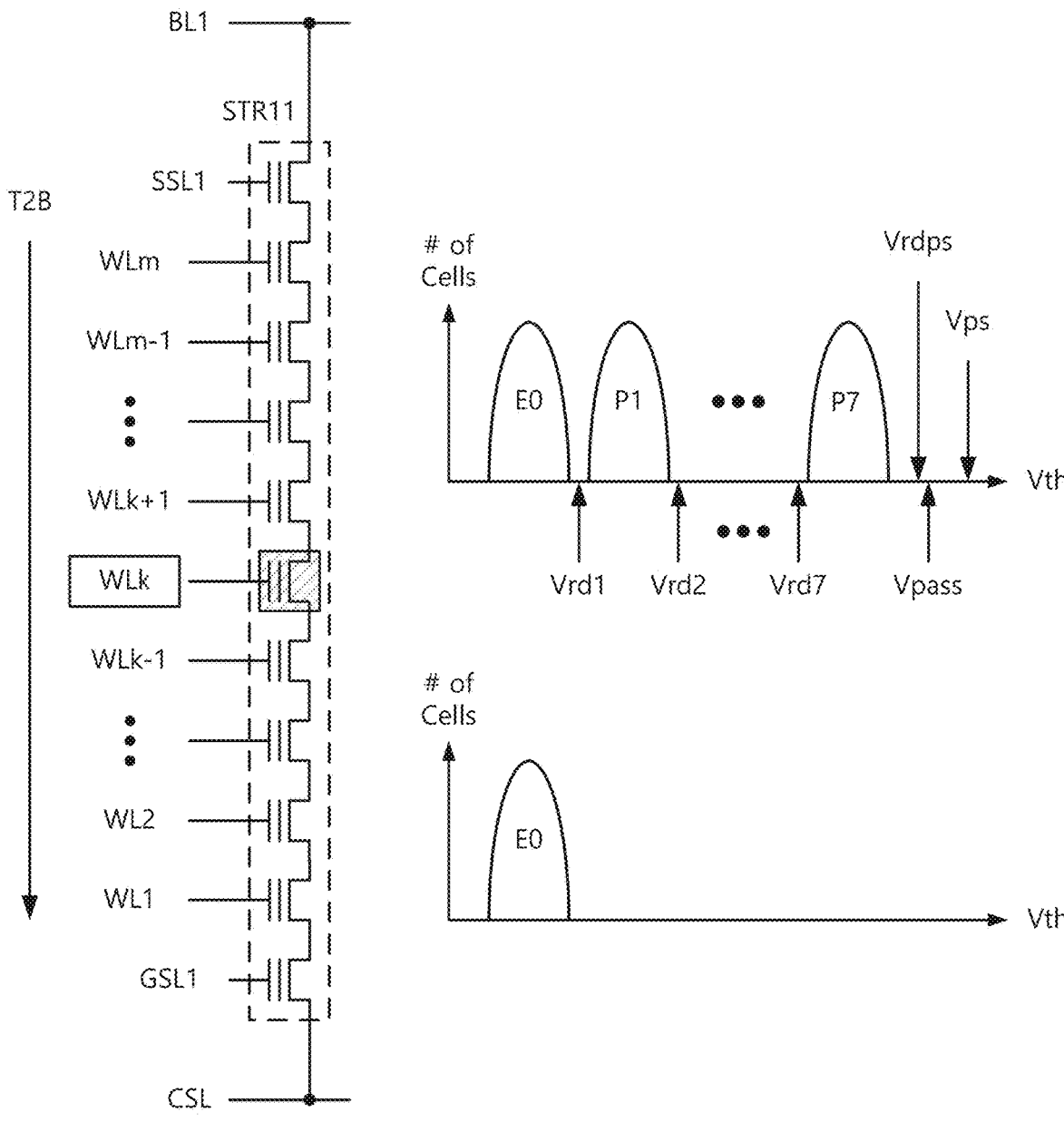
FIG. 5 is a diagram illustrating threshold voltage distributions of memory cells illustrated in FIG. 4, according to some embodiments.

FIG. 5 is a diagram illustrating an example of threshold voltage distributions of memory cells illustrated in FIG. 4, according to some embodiments. In FIG. 4, a horizontal axis represents the threshold voltage Vth, and a vertical axis represents a number of memory cells.

FIG. 5 shows an example in which 3-bit data is stored in one memory cell. A 3-bit memory cell may have one of eight states (E0, P1 to P7) according to the threshold voltage distribution. E0 represents an erase state, and P1 to P7 represent program states.

During a read operation, the selection read voltages Vrd1 to Vrd7 may be provided to the selected word line sWL, and the pass voltage Vps and/or the read pass voltage Vrdps may be provided to the unselected word lines uWL. The pass voltage Vps and/or the read pass voltage Vrdps may be a voltage sufficient to turn on the memory cells. For example, the pass voltage Vps may be provided to the adjacent word lines WLk+1, and the read pass voltage Vrdps may be provided to the unselected word lines other than the adjacent word lines.

The first selection read voltage Vrd1 may be a voltage level between the erase state E0 and the first program state P1. The second selection read voltage Vrd2 may be a voltage level between the first and second program states P1 and P2. In this way, the seventh selection read voltage Vrd7 may be a voltage level between the sixth and seventh program states P6 and P7.

When the first selection read voltage Vrd1 is applied, the memory cell in the erase state E0 may be an on cell and the memory cell in the first to seventh program states P1 to P7 may be an off cell. When the second selection read voltage Vrd2 is applied, the memory cell in the erase state E0 and the first program state P1 may an on cell, and the memory cell in the second to seventh program states P2 to P7 may an off cell. In this way, when the seventh selection read voltage Vrd7 is applied, the memory cell in the erase state E0 and the first to sixth program states P1 to P6 may be an on cell and the memory cell in the seventh program state P7 may be an off cell.

During a read operation, the k-th word line WLk may be selected. A power voltage may be applied to the string selection line SSL1 and the ground selection line GSL1, and the string select transistor SST and the ground select transistor GST may be turned on. The selection read voltage Vrd may be provided to the selected word line sWL, and the read pass voltage Vrdps and/or the pass voltage Vps may be provided to the unselected word lines uWL.

When the read operation of the k-th word line WLk is repeatedly performed, the high voltage read pass voltage Vrdps may be repeatedly provided to the remaining word lines. In this situation, a read disturbance may occur in the remaining word lines, and thus the threshold voltage may be distorted. Memory cells connected to the k-th word line WLk may be off cells when a selection read voltage is provided. That is, when the threshold voltage of the k-th memory cell is higher than the selection read voltage, the k-th memory cell may be an off cell. When the k-th memory cell is an off cell, a channel may be separated at the k-th memory cell. That is, a lower channel of the k-th memory cell may receive a ground voltage from the common source line CSL, and an upper channel of the k-th memory cell may have a negative channel voltage.

A channel voltage difference may occur between a lower channel and an upper channel with the k-th memory cell interposed therebetween. Due to the channel voltage difference, hot carrier injection (HCI) may occur in an adjacent memory cells MCk+1 and/or MCk−1. For this reason, threshold voltages of memory cells connected to adjacent word lines WLk+1 and/or WLk−1 may be distorted. For example, the threshold voltages of memory cells in the erased state E0 may rise to enter the programmed state.

Figure 6:
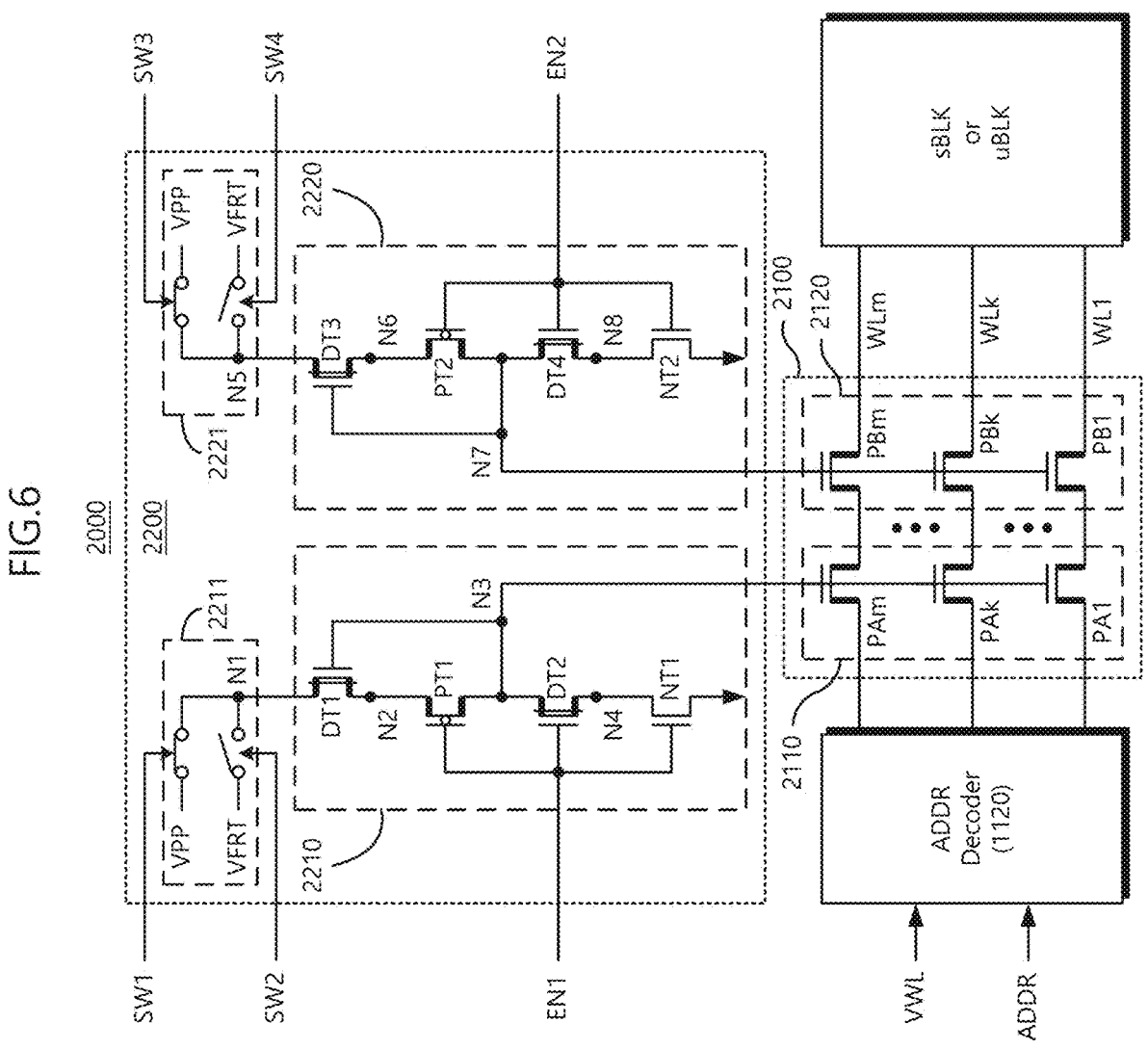
FIG. 6 is a circuit diagram illustrating an block selection circuit in the memory device illustrated in FIG. 2, according to some embodiments.

FIG. 6 is a circuit diagram illustrating an example of a block selection circuit of the memory device 1100 illustrated in FIG. 2, according to some embodiments. Referring to FIGS. 2 and 6, the block selection circuit 2000 may provide a read voltage, program voltage, or erase voltage to a selected memory block (sBLK) among a plurality of memory blocks (BLK1 to BLKn). The block selection circuit 2000 may include a pass transistor circuit 2100 and a pass transistor driver 2200.

The pass transistor circuit 2100 may include a first pass transistor circuit 2110 and a second pass transistor circuit 2120. The first pass transistor circuit 2110 may include a plurality of first pass transistors (PA1 to PAm). The second pass transistor circuit 2120 may include a plurality of second pass transistors (PB1 to PBm). The first and second pass transistors may be high-voltage NMOS transistors that are resistant to high voltages such as the program voltage (Vpgm) or the erase voltage (Vers).

The pass transistor circuit 2100 may be connected between the address decoder 1120 and the memory block (sBLK or uBLK). For example, two pass transistors PA1 and PB1 may be connected in series between the address decoder 1120 and the first word line WL1. Two pass transistors (PAK, PBk) may be connected in series between the address decoder 1120 and the k-th word line (WLk). Two pass transistors (PAm, PBm) may be connected in series between the address decoder 1120 and the m-th word line (WLm).

The pass transistor driver 2200 may provide gate voltages to the plurality of first pass transistors (PA1 to PAm) and the plurality of second pass transistors (PB1 to PBm) of the pass transistor circuit 2100. The pass transistor driver 2200 may include a first driver circuit 2210, a first switch circuit 2211, a second driver circuit 2220, and a second switch circuit 2221.

The first driver circuit 2210 may include a first depletion transistor DT1 and a second depletion transistor DT2, a first PMOS transistor PT1, and a first NMOS transistor NT1. The first depletion transistor DT1 may be connected between a first node N1 and a second node N2, and may be turned on or off depending on the voltage level of a third node N3. The second depletion transistor DT2 may be connected between the third node N3 and a fourth node N4, and may be turned on or off according to a first enable signal EN1. The first enable signal EN1 may be provided from the control logic 1160. The first and second depletion transistors DT1 and DT2 may be high-voltage depletion transistors that are durable against high voltage.

The first driver circuit 2210 may operate as an inverter including the first PMOS transistor PT1 and the first NMOS transistor NT1. The first PMOS transistor PT1 may be connected between the second node N2 and the third node N3 and may be turned on or off according to the first enable signal EN1. The first PMOS transistor PT1 may be a high-voltage PMOS transistor that is durable against high voltage. The first NMOS transistor NT1 may be connected between the fourth node N4 and the ground terminal, and may be turned on or off according to the first enable signal EN1.

The first switch circuit 2211 may receive a first switch signal SW1 and a second switch signal SW2 from the control logic 1160. The first switch circuit 2211 may supply a first power voltage VPP or a second power voltage VFRT to the first node N1. The first switch circuit 2211 may provide the first power voltage VPP when the first switch signal SW1 is input. The first switch circuit 2211 may provide the second power voltage VFRT when the second switch signal SW2 is input. The first power voltage VPP may be higher than the second power voltage VFRT.

The first driver circuit 2210 may provide the first power voltage VPP or the second power voltage VFRT to the first pass transistor circuit 2110 according to the control of the first enable signal EN1 and/or the first switch circuit 2211. Assume that the first enable signal EN1 is at a low level. The first driver circuit 2210 may provide the first power voltage VPP when the first switch signal SW1 is input. The first driver circuit 2210 may provide the second power voltage VRFT when the second switch signal SW2 is input.

The second driver circuit 2220 may include a third depletion transistor DT3 and a fourth depletion transistor DT4, a second PMOS transistor PT2, and a second NMOS transistor NT2. The third depletion transistor DT3 may be connected between a fifth node N5 and a sixth node N6, and may be turned on or off depending on the voltage level of a seventh node N7. The fourth depletion transistor DT4 may be connected between the seventh node N7 and a eighth node N8, and may be turned on or off according to a second enable signal EN2. The second enable signal EN2 may be provided from the control logic 1160. The third and fourth depletion transistors DT3 and DT4 may be high-voltage depletion transistors that are durable against high voltage.

The second driver circuit 2220 may operate as an inverter including the second PMOS transistor PT2 and the second NMOS transistor NT2. The second PMOS transistor PT2 may be connected between the sixth node N6 and the seventh node N7 and may be turned on or off according to the second enable signal EN2. The second PMOS transistor PT2 may be a high-voltage PMOS transistor that is durable against high voltage. The second NMOS transistor NT2 may be connected between the eighth node N8 and the ground terminal, and may be turned on or off according to the second enable signal EN2.

The second switch circuit 2221 may receive a third switch signal SW3 and a fourth switch signal SW4 from the control logic 1160. The second switch circuit 2221 may supply a first power voltage VPP or a second power voltage VFRT to a fifth node N5. The second switch circuit 2221 may provide the first power voltage VPP when the third switch signal SW3 is input. And the second switch circuit 2221 may provide the second power voltage VFRT when the fourth switch signal SW4 is input.

The second driver circuit 2220 may provide the first power voltage VPP or the second power voltage VFRT to the second pass transistor circuit 2120 according to the control of the second enable signal EN2 and/or the second switch circuit 2221. Assume that the second enable signal EN2 is at a low level. The second driver circuit 2220 may provide the first power voltage VPP when the third switch signal SW3 is input. The second driver circuit 2220 may provide the second power voltage VRFT when the fourth switch signal SW4 is input.

Figure 7:
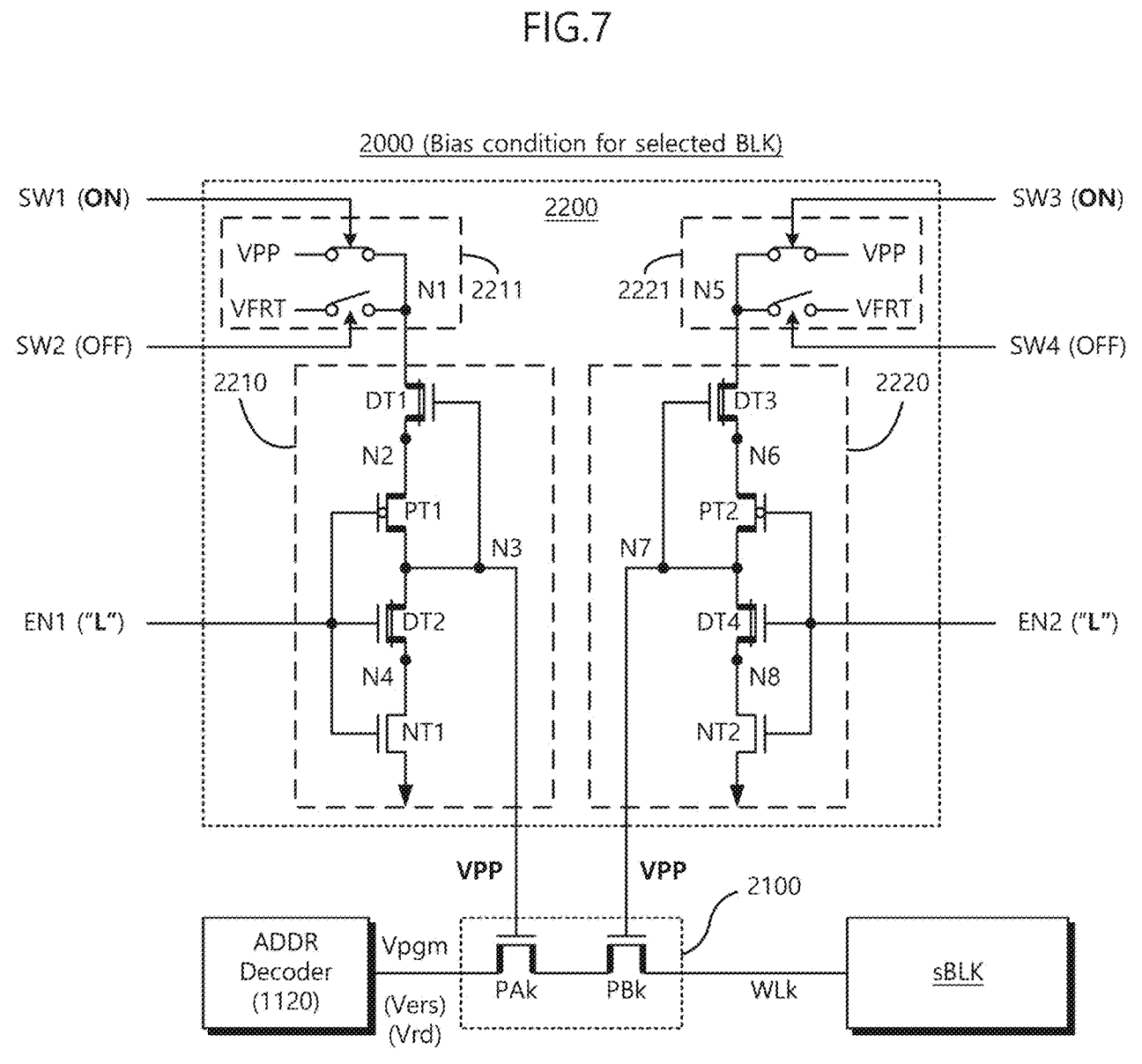

FIGS. 7 and 8 are respectively a circuit diagram and a table illustrating bias conditions of the block selection circuit 2000 shown in FIG. 6, according to some embodiments. Referring to FIGS. 7 and 8, the first power voltage VPP may be provided to the gates of the first and second pass transistors PAK and PBk of the selected memory block sBLK during a read, program, or erase operation.

During a read, program, or erase operation, the first switch signal SW1 of the first switch circuit 2211 may be ON and the second switch signal SW2 may be OFF. The third switch signal SW3 of the second switch circuit 2211 may be ON and the fourth switch signal SW4 may be OFF. The first enable signal EN1 of the first driver circuit 2210 may be at a low level (L). The second enable signal EN2 of the second driver circuit 2220 may be at a low level (L).

Under these bias conditions, the first and second PMOS transistors (PT1, PT2) may be turned on, and the first and second NMOS transistors (NT1, NT2) may be turned off. Third and seventh nodes (N3, N7) may have a voltage level of the first power voltage VPP. The selection read voltage Vrd, program voltage Vpgm, or erase voltage Vers may be provided to the selected word line sWL (e.g., WLk). A read pass voltage Vrdps, a pass voltage Vpass, or an erase voltage Vers may be provided to the unselected word lines uWL.

FIGS. 9 to 12 are circuit diagrams illustrating bias conditions for the unselected memory block shown in FIG. 6, according to some embodiments, and FIG. 13 is a table illustrating bias conditions for the unselected memory block, according to some embodiments.

Figure 9:
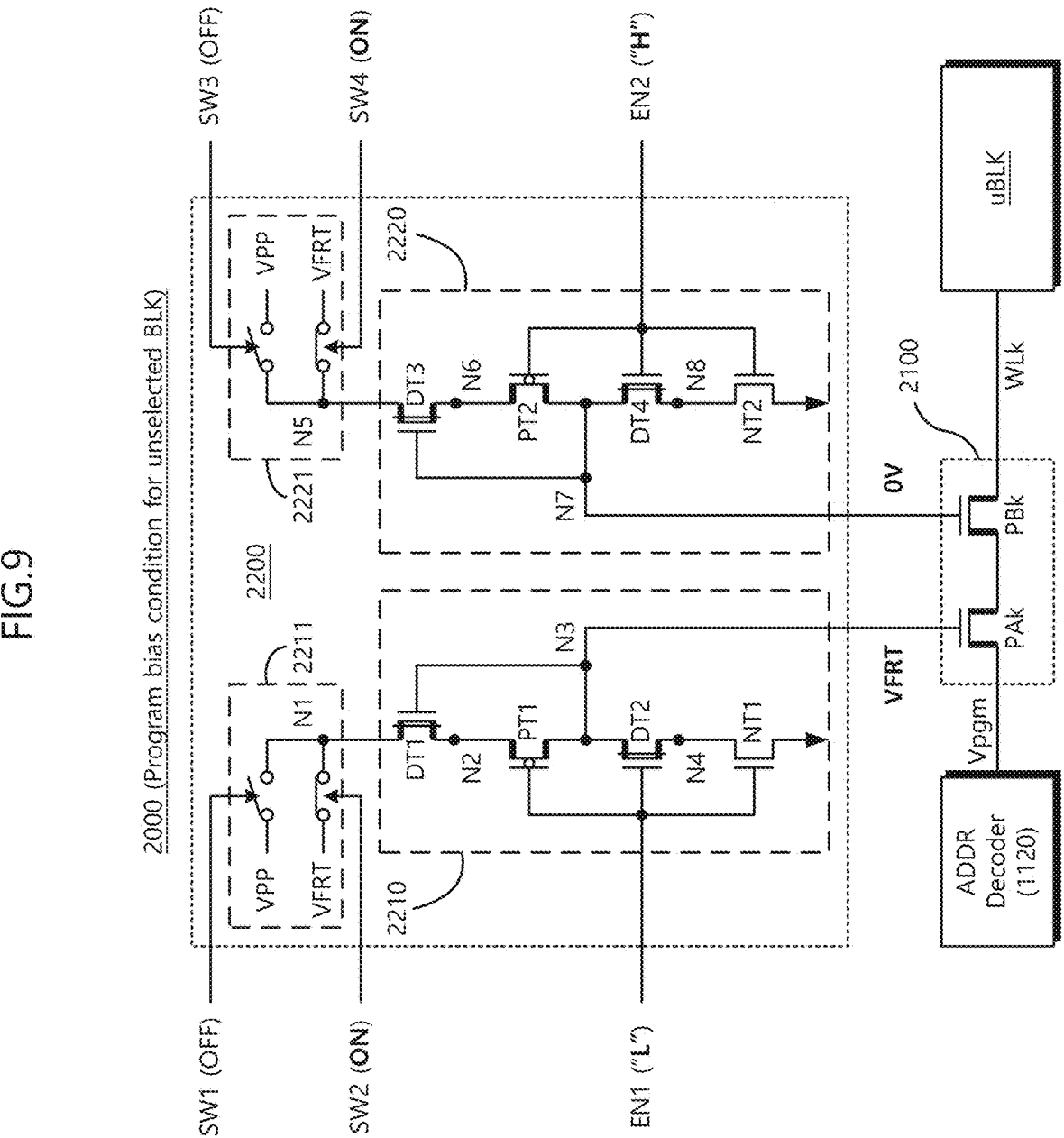

FIG. 9 illustrates an example embodiment in which the second power voltage VFRT is applied to the first pass transistor PAK of the unselected memory block uBLK and 0V is applied to the second pass transistor PBk during a program operation. FIG. 11 illustrates an example embodiment in which 0V is applied to the first pass transistor PAK of the unselected memory block uBLK and the second power voltage VFRT is applied to the second pass transistor PBk during an erase operation.

Referring to FIGS. 9 and 13, during a program operation, the first switch signal SW1 of the first switch circuit 2211 may be OFF and the second switch signal SW2 may be ON. The first enable signal EN1 of the first driver circuit 2210 may be at a low level (L). Under these bias conditions, the first PMOS transistor PT1 may be turned on and the first NMOS transistor NT1 may be turned off. The third node N3 may have a voltage level of the second power voltage VFRT.

The third switch signal SW3 of the second switch circuit 2221 may be OFF and the fourth switch signal SW4 may be ON. The second enable signal EN2 of the second driver circuit 2220 may be at a high level (H). Under these bias conditions, the second PMOS transistor PT2 may be turned off and the second NMOS transistor NT2 may be turned on. The seventh node N7 may have a ground voltage (e.g., 0V).

Figure 10:
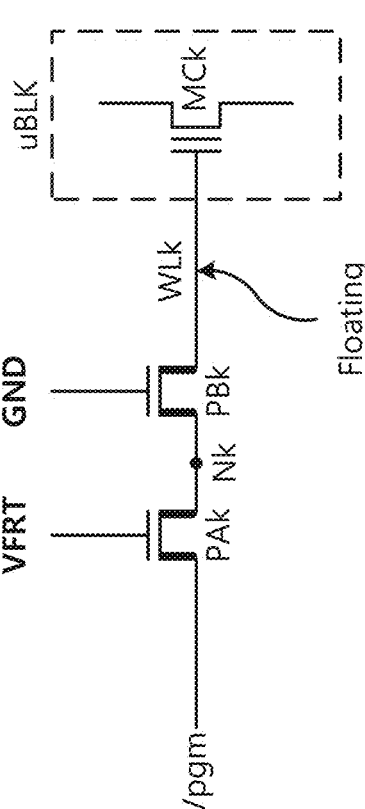

Referring to FIG. 10, a program voltage Vpgm (e.g., 16V) may be applied to a drain of the first pass transistor PAK, and a second power voltage VFRT (e.g., 10V) may be applied to a gate of the first pass transistor PAK. The voltage level of the k-th node Nk may be VFRT-Vtha. Here, Vtha is a threshold voltage of the first pass transistor PAK. When a ground voltage GND (e.g., 0V) is applied to a gate of the second pass transistor PBk, the second pass transistor PBk and the k-th word line WLk may be in a floating state. When the second pass transistor PBk and the k-th word line (WLk; k=1~m) are in the floating state, the unselected memory block uBLK may be program-inhibited.

FIGS. 11 and 13, during an erase operation, the first switch signal SW1 of the first switch circuit 2211 may be OFF and the second switch signal SW2 may be ON. The first enable signal EN1 of the first driver circuit 2210 may be at a high level (H). Under these bias conditions, the first PMOS transistor PT1 may be turned off and the first NMOS transistor NT1 may be turned on. The third node N3 may have a ground voltage (e.g., 0V).

The third switch signal SW3 of the second switch circuit 2221 may be OFF and the fourth switch signal SW4 may be ON. The second enable signal EN2 of the second driver circuit 2220 may be at a low level (L). Under these bias conditions, the second PMOS transistor PT2 may be turned on and the second NMOS transistor NT2 may be turned off. The seventh node N7 may have a voltage level of the second power voltage VFRT.

Figure 12:
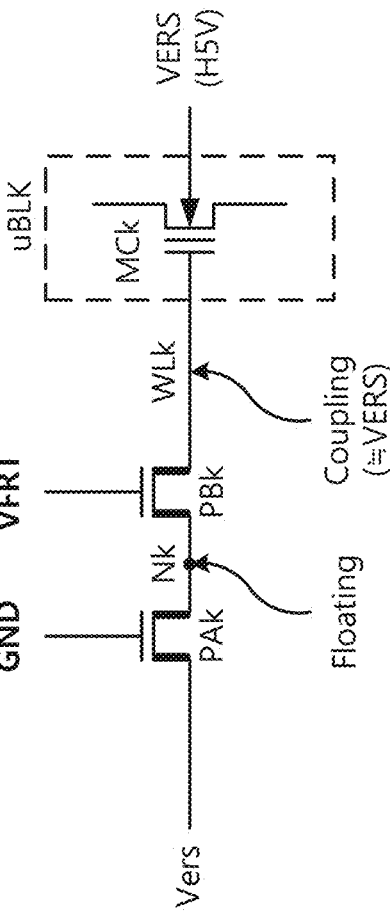

Referring to FIG. 12, an erase voltage Vers (e.g., 2V) may be applied to the drain of the first pass transistor PAK, and a ground voltage GND (e.g., 0V) may be applied to the gate of the first pass transistor PAK. Thus, the first pass transistor Pak and k-th node (Nk) may be in a floating state.

Assume that the second power voltage VFRT (e.g., 10V) is applied to the gate of the second pass transistor PBk. The k-th word line WLk may rise to the body voltage VERS (e.g., 15V) provided to the body of the memory cell due to the coupling effect. When the k-th word line (WLk; k=1~m) is coupled, the unselected memory block uBLK may be erase-inhibited.

When the k-th word line WLk rises to the body voltage due to the coupling effect, a voltage level of the k-th node Nk may be VFRT-Vthb. Here, Vthb is the threshold voltage of the second pass transistor PBk. The first pass transistor PAK only needs to have durability against a voltage level VFRT-Vthb. The block selection circuit 2000 according to example embodiments may reduce the high voltage that each pass transistor must endure during a program or erase operation. Therefore, the block selection circuit 2000 according to example embodiments may reduce the size of individual pass transistors.

Figure 14:
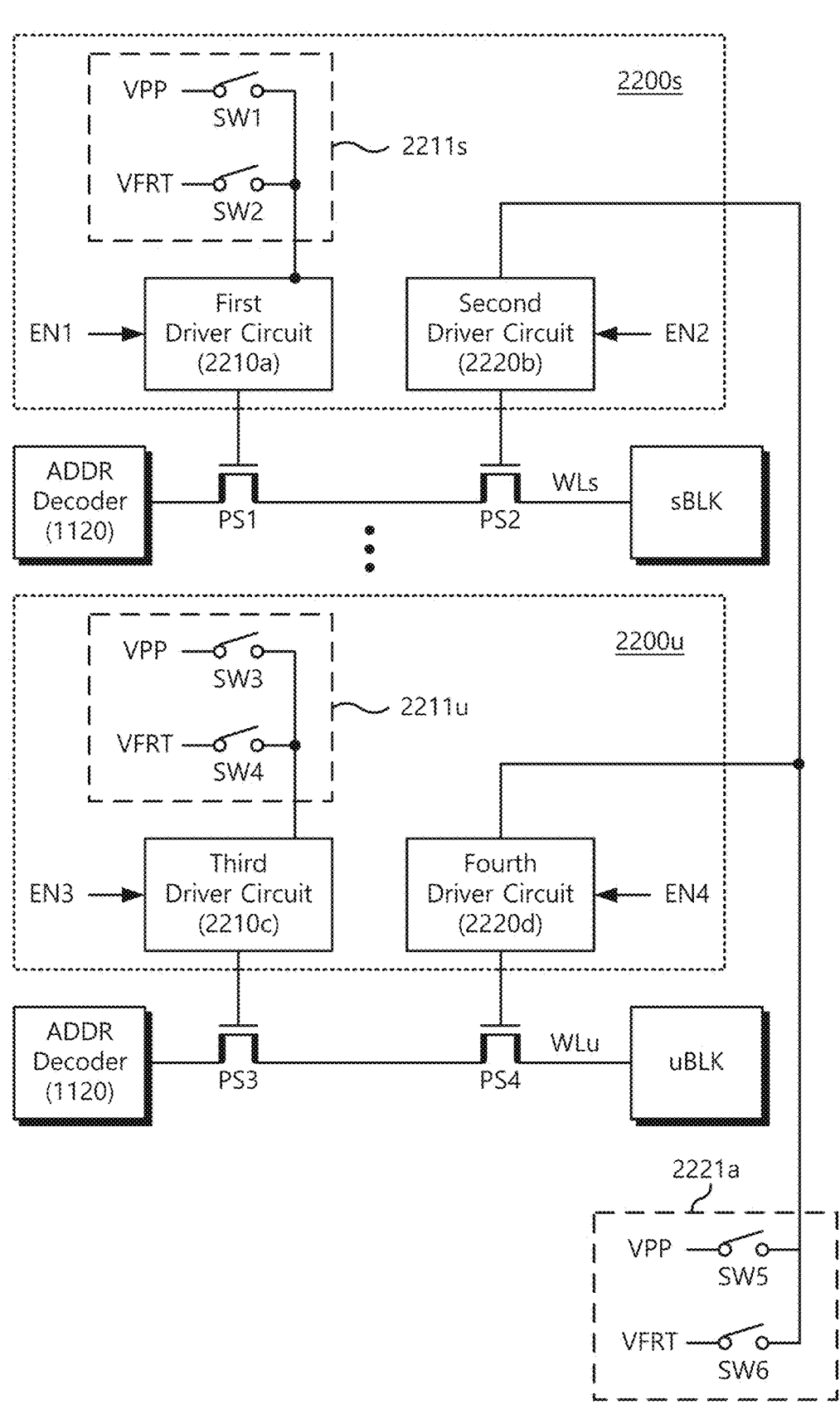
FIG. 14 is a circuit diagram illustrating a block selection circuit of the memory device illustrated in FIG. 2, according to some embodiments.

FIG. 14 is a circuit diagram illustrating the block selection circuit 2000 shown in FIG. 2, according to some embodiments. Referring to FIG. 14, the block selection circuit 2000 may include a selection pass transistor driver 2200s, a unselected pass transistor driver 2200u, and a shared switch circuit 2221a.

The selection pass transistor driver 2200s may provide gate voltages for turning on or off the pass transistors PS1 and PS2 of the selected memory block sBLK. The unselected pass transistor driver 2200u may provide gate voltages for turning on or off the pass transistors PS3 and PS4 of the unselected memory block uBLK. The shared switch circuit 2221a may provide the first power voltage VPP or the second power voltage VFRT to the selected pass transistor driver 2200s and the unselected pass transistor driver 2200u.

The selection pass transistor driver 2200s may provide gate voltages to the first and second pass transistors PS1 and PS2. The selection pass transistor driver 2200s may include a first driver circuit 2210a, a selection switch circuit 2211s, and a second driver circuit 2220b.

In some embodiments, the first driver circuit 2210a may have the same configuration and operating principle as the driver circuit shown in FIG. 6. As shown in FIG. 6, the first driver circuit 2210a may operate as an inverter including the first PMOS transistor PT1 and the first NMOS transistor NT1. The first driver circuit 2210a may provide a power voltage or a ground voltage to the first pass transistor PS1 according to the first enable signal EN1.

The first driver circuit 2210a may provide the first power voltage VPP or the second power voltage VFRT to the first pass transistor PS1 according to the control of the first enable signal EN1 and/or the selection switch circuit 2211s. If the first enable signal EN1 is at a high level, the first driver circuit 2210a may provide a ground voltage to the first pass transistor PS1. If the first enable signal EN1 is at a low level, the first driver circuit 2210a may provide the first power voltage VPP to the first pass transistor PS1 when the first switch signal SW1 is input. The first driver circuit 2210a may provide the second power voltage VFRT to the first pass transistor PS1 when the second switch signal SW2 is input.

The selection switch circuit 2211s may receive the first and second switch signals (SW1, SW2) from the control logic 1160, and may provide the first power voltage VPP or the second power voltage VFRT to the first driver circuit 2210a. The selection switch circuit 2211s may provide a first power voltage VPP to the first driver circuit 2210a when the first switch signal SW1 is input, and may provide a second power voltage VFRT to the first driver circuit 2210a when the second switch signal SW2 is input.

The second driver circuit 2220b may provide the power voltage or ground voltage to the second pass transistor PS2 according to the second enable signal EN2. The second driver circuit 2220b may provide the first power voltage VPP or the second power voltage VFRT to the second pass transistor PS2 according to the control of the second enable signal EN2. When the second enable signal EN2 is at a high level, the second driver circuit 2220b may provide a ground voltage to the second pass transistor PS2. When the second enable signal EN2 is at a low level, the second driver circuit 2220b may provide the first power voltage VPP or the second power voltage VFRT to the second pass transistor PS2 under the control of the shared switch circuit 2221a.

The unselected pass transistor driver 2200u may provide gate voltages to the third and fourth pass transistors PS3 and PS4. The unselected pass transistor driver 2200u may include a third driver circuit 2210c, a unselected switch circuit 2211u, and a fourth driver circuit 2220d.

The third driver circuit 2210c may provide the power voltage or ground voltage to the third pass transistor PS3 according to the third enable signal EN3. The third driver circuit 2210c may provide the first power voltage VPP or the second power voltage VFRT to the third pass transistor PS3 according to the control of the third enable signal EN3 and/or the unselected switch circuit 2211*u*. If the third enable signal EN3 is at a high level, the third driver circuit 2210*c* may provide a ground voltage to the third pass transistor PS3. If the third enable signal EN3 is at a low level, the third driver circuit 2210*c* may provide the first power voltage VPP to the third pass transistor PS3 when the third switch signal SW3 is input, and the third driver circuit 2210*c* may provide the second power voltage VFRT to the third pass transistor PS3 when the fourth switch signal SW4 is input.

The unselected switch circuit 2211*u* may receive the third and fourth switch signals SW3 and SW4 from the control logic 1160, and may apply the first power voltage VPP or the second power voltage VFRT to the third driver circuit 2210*c*. The unselected switch circuit 2211*u* may provide the first power voltage VPP to the third driver circuit 2210*c* when the third switch signal SW3 is input. The unselected switch circuit 2211*u* may provide the second power voltage VFRT to the third driver circuit 2210*c* when the fourth switch signal SW4 is input.

The fourth driver circuit 2220*d* may provide the power voltage or ground voltage to the fourth pass transistor PS4 according to the fourth enable signal EN4. The fourth driver circuit 2220*d* may provide the first power voltage VPP or the second power voltage VFRT to the fourth pass transistor PS4 according to the control of the fourth enable signal EN4. When the fourth enable signal EN4 is at a high level, the fourth driver circuit 2220*d* may provide a ground voltage to the fourth pass transistor PS4. When the fourth enable signal EN4 is at a low level, the fourth driver circuit 2220*d* may provide the first power voltage VPP or the second power voltage VRFT to the fourth pass transistor PS4 under the control of the shared switch circuit 2221*a*.

The shared switch circuit 2211*a* may receive fifth and sixth switch signals SW5 and SW6 from the control logic 1160, and may provide the first power voltage VPP or the second power voltage VFRT to the second and fourth driver circuits 2220*b* and 2220*d*. The shared switch circuit 2211*a* may provide a first power voltage VPP to the second and fourth driver circuits (2220*b*, 2220*d*) when the fifth switch signal SW5 is input, and may provide a second power voltage VFRT to the second and fourth driver circuits (2220*b*, 2220*d*) when the sixth switch signal SW6 is input.

The block selection circuit 2000 shown in FIG. 14 may control driver circuits (e.g., 2220*b* and 2220*d*) of the selected memory block sBLK and the unselected memory block uBLK using the shared switch circuit 2221*a*. Therefore, since the block selection circuit 2000 shown in FIG. 14 commonly may use the shared switch circuit 2221*a*, the area may be reduced compared to using an individual switch circuit. As the number of memory blocks increases, the effect of reducing the area of the block selection circuit 2000 may be increased.

Figure 15:
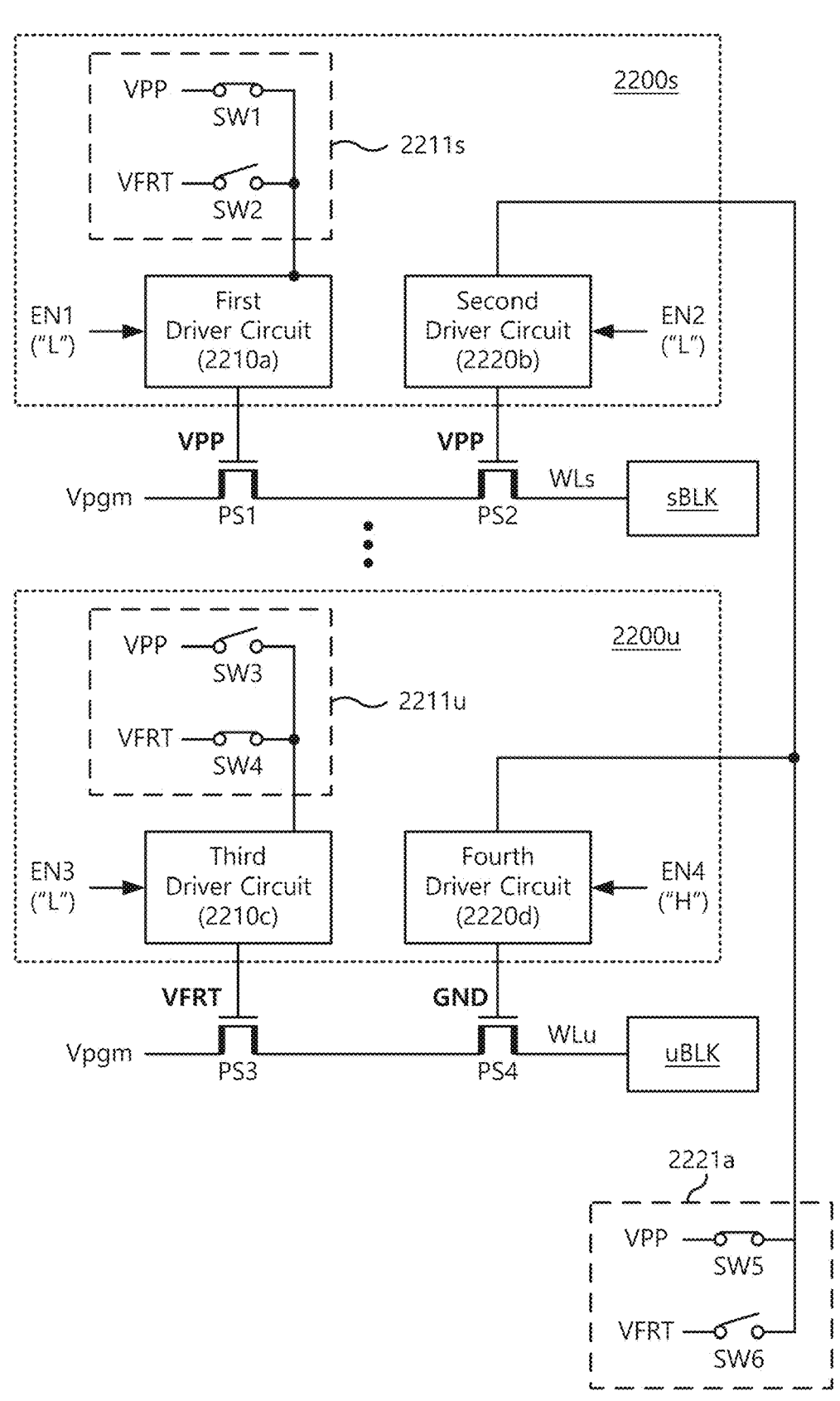
FIGS. 15 and 16 are circuit diagrams respectively illustrating bias conditions during program and erase operations of the block selection circuit shown in FIG. 14, according to some embodiments.
Figure 16:
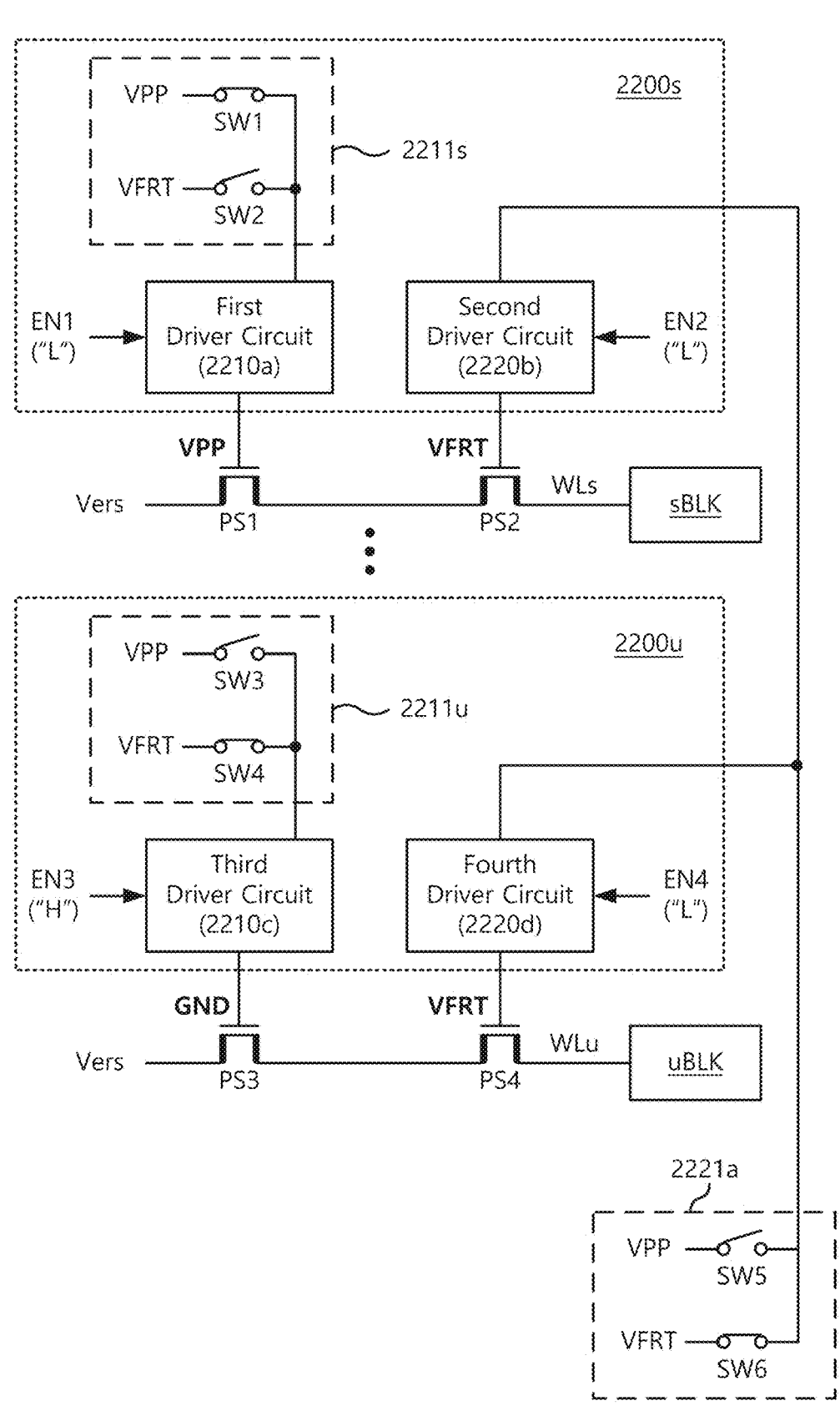

FIGS. 15 and 16 are circuit diagrams illustrating bias conditions during program and erase operations of the block selection circuit shown in FIG. 14, according to some embodiments. FIG. 15 illustrates bias conditions during the program operation, and FIG. 16 illustrates bias conditions during the erase operation.

Referring to FIG. 15, during a program operation, the first switch signal SW1 of the selection switch circuit 2211*s* may be ON and the second switch signal SW2 may be OFF. The fifth switch signal SW5 of the shared switch circuit 2221*a* may be ON, and the sixth switch signal SW6 may be OFF. The first enable signal EN1 of the first driver circuit 2210*a* may be at a low level (L). The second enable signal EN2 of the second driver circuit 2220*b* may be at a low level (L).

Under these bias conditions, the first driver circuit 2210*a* may provide the first power voltage VPP to the first pass transistor PS1. The second driver circuit 2220*b* may also provide the first power voltage VPP to the second pass transistor PS2. The program voltage Vpgm may be provided to the word line WLs of the selected memory block sBLK. The pass voltage Vpass may be provided to the remaining word lines of the selected memory block sBLK.

During a program operation, the third switch signal SW3 of the unselected switch circuit 2211*u* may be OFF and the fourth switch signal SW4 may be ON. The fifth switch signal SW5 of the shared switch circuit 2221*a* may be ON, and the sixth switch signal SW6 may be OFF. The third enable signal EN3 of the third driver circuit 2210*c* may be at a low level (L). The fourth enable signal EN4 of the fourth driver circuit 2220*d* may be at a high level (H).

Under these bias conditions, the third driver circuit 2210*c* may provide the second power voltage VFRT to the third pass transistor PS3. The fourth driver circuit 2220*d* may also provide a ground voltage GND (e.g., 0V) to the fourth pass transistor PS4. The program voltage Vpgm or the pass voltage Vpass may be applied to the drain of the third pass transistor PS3. The second power voltage VFRT may be applied to the gate of the third pass transistor PS3. When the ground voltage (e.g., 0V) is applied to the gate of the fourth pass transistor PS4, the fourth pass transistor PS4 and the u-th word line WLu may be in a floating state. When the fourth pass transistor PS4 and the u-th word line (WLu; u=1~m) are in the floating state, the unselected memory block uBLK may be program-inhibited.

Referring to FIG. 16, during an erase operation, the first switch signal SW1 of the selection switch circuit 2211*s* may be ON and the second switch signal SW2 may be OFF. The fifth switch signal SW5 of the shared switch circuit 2221*a* may be OFF, and the sixth switch signal SW6 may be ON. The first enable signal EN1 of the first driver circuit 2210*a* may be at a low level (L). The second enable signal EN2 of the second driver circuit 2220*b* may be at a low level (L).

Under these bias conditions, the first driver circuit 2210*a* may provide the first power voltage VPP to the first pass transistor PS1. The second driver circuit 2220*b* may provide the second power voltage VFRT to the second pass transistor PS2. The erase voltage Vers may be provided to the word line WLs of the selected memory block sBLK. The erase body voltage (VERS, see FIG. 12) may be provided to the bodies of memory cells of the selected memory block sBLK.

During an erase operation, the third switch signal SW3 of the unselected switch circuit 2211*u* may be OFF and the fourth switch signal SW4 may be ON. The fifth switch signal SW5 of the shared switch circuit 2221*a* may be OFF, and the sixth switch signal SW6 may be ON. The third enable signal EN3 of the third driver circuit 2210*c* may be at a high level (H). The fourth enable signal EN4 of the fourth driver circuit 2220*d* may be at a low level (L).

Under these bias conditions, the third driver circuit 2210*c* may provide a ground voltage (e.g., 0V) to the third pass transistor PS3. The fourth driver circuit 2220*d* may provide the second power voltage VFRT to the fourth pass transistor PS4. The erase voltage Vers may be applied to the drain of the third pass transistor PS3, and a ground voltage (e.g., 0V) may be applied to the gate the third pass transistor PS3.

When the second power voltage VFRT is applied to the gate of the fourth pass transistor PS4, the u-th word line WLu rises to the erase body voltage VERS provided to the body of the memory cell due to a coupling effect. When the u-th word line WLu is coupled, the unselected memory block uBLK may be erase-inhibited.

Figure 17:
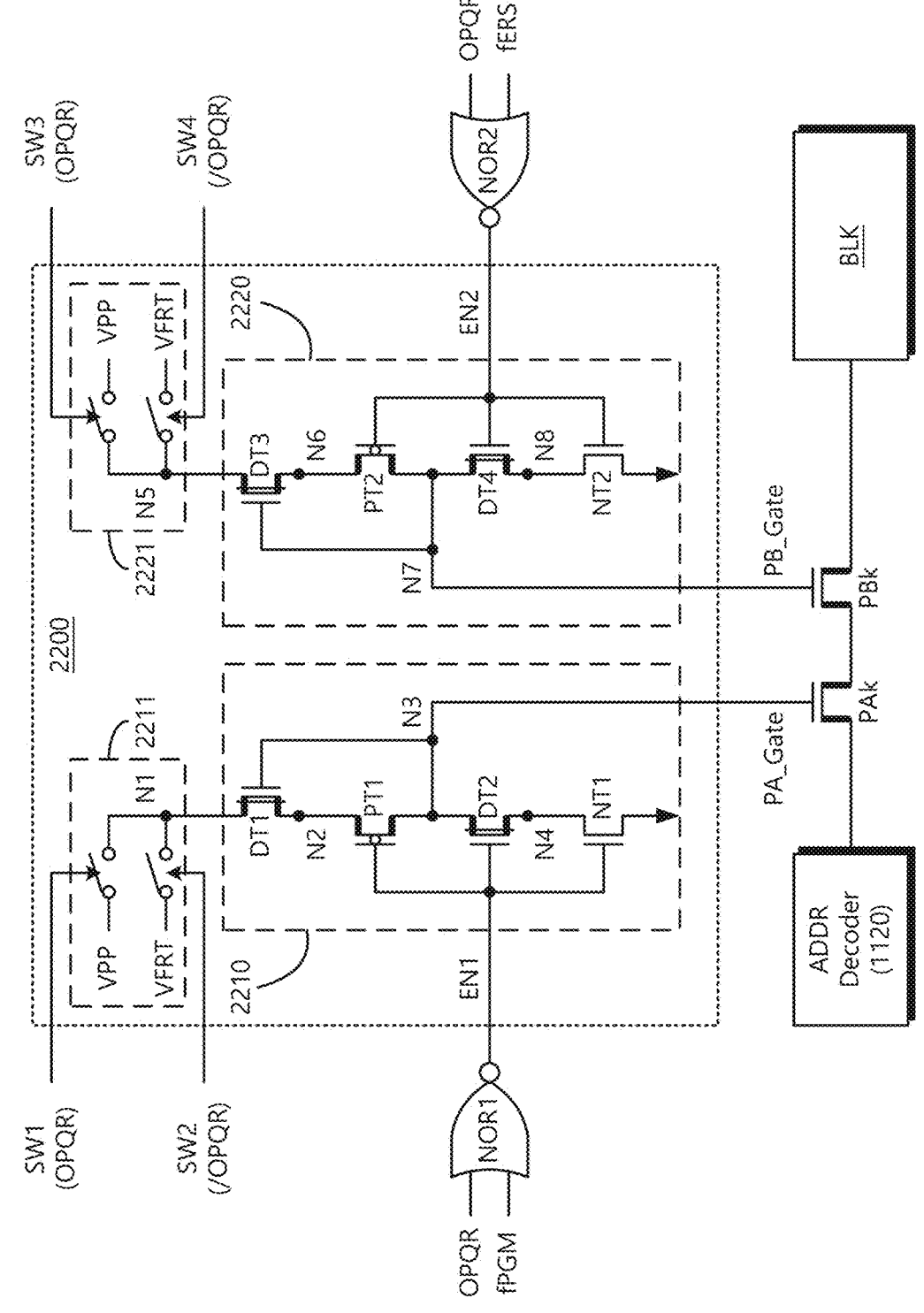

FIGS. 17 to 19 are circuit diagram and tables illustrating a method of generating switch signals and enable signals shown in FIG. 2, according to some embodiments. The block selection circuit 2000 may include the pass transistor driver 2200, and the pass transistor driver 2200 may the first driver circuit 2210, the first switch circuit 2211, the second driver circuit 2220, and the second switch circuit 2221 similar to FIG. 6. Accordingly, repeated description thereof is omitted for conciseness. However, referring to FIGS. 2 and 17, the block selection circuit 2000 may include a first NOR gate NOR1 and a second NOR gate NOR2, and the switch signals SW and the enable signals EN may be provided from the control logic 1160.

The switch signals SW may be generated using an OPQR signal. The OPQR signal may be generated from the block address. The OPQR signal may be at a high level when the block address is for a selected memory block sBLK, and may be at a low level when the block address is for an unselected memory block uBLK. That is, the switch signals SW may be ON if the block address is for the selected memory block sBLK, and may be OFF if the block address is for the unselected memory block uBLK.

For example, when the memory block BLK is the selected memory block sBLK, OPQR is at a high level and the first and third switch signals SW1 and SW3 may be turned on. On the other hand, if the memory block BLK is the unselected memory block uBLK, OPQR is at a low level and the second and fourth switch signals SW2 and SW4 may be turned on.

The first enable signal EN1 may be generated through a logical operation of the OPQR signal and a program operation signal fPGM. For example, the first enable signal EN1 may be generated through NOR operation of the OPQR signal and the fPGM signal. The first NOR gate NOR1 may receive the OPQR signal and the fPGM signal and output the first enable signal EN1.

Referring to FIG. 18, the first NOR gate NOR1 may output a high-level first enable signal EN1 when both the OPQR signal and the fPGM signal are low level, and in other cases, the first NOR gate NOR1 may output a low-level first enable signal EN1.

The second enable signal EN2 may be generated through a logical operation of the OPQR signal and an erase operation signal fERS. For example, the second enable signal EN2 may be generated through NOR operation of the OPQR signal and the fERS signal. The second NOR gate NOR2 may receive the OPQR signal and the fERS signal and output the second enable signal EN2.

Referring to FIG. 18, the second NOR gate NOR2 may output a high-level second enable signal EN2 when both the OPQR signal and the fERS signal are low level, and in other cases, the second NOR gate NOR2 may output a low-level second enable signal EN2.

Referring to FIGS. 17 and 19, in the case of the selected memory block sBLK, the first power voltage VPP may be provided to the gates PA_Gate and PB_Gate of the first and second pass transistors PAK and PBk, respectively. In the case of the unselected memory block uBLK, the second power voltage VFRT may be provided to the gate PA_Gate of the first pass transistor PAK during a program operation. During an erase operation, the second power voltage VFRT may be provided to the gate PB_Gate of the second pass transistor PBk.

Figure 20:
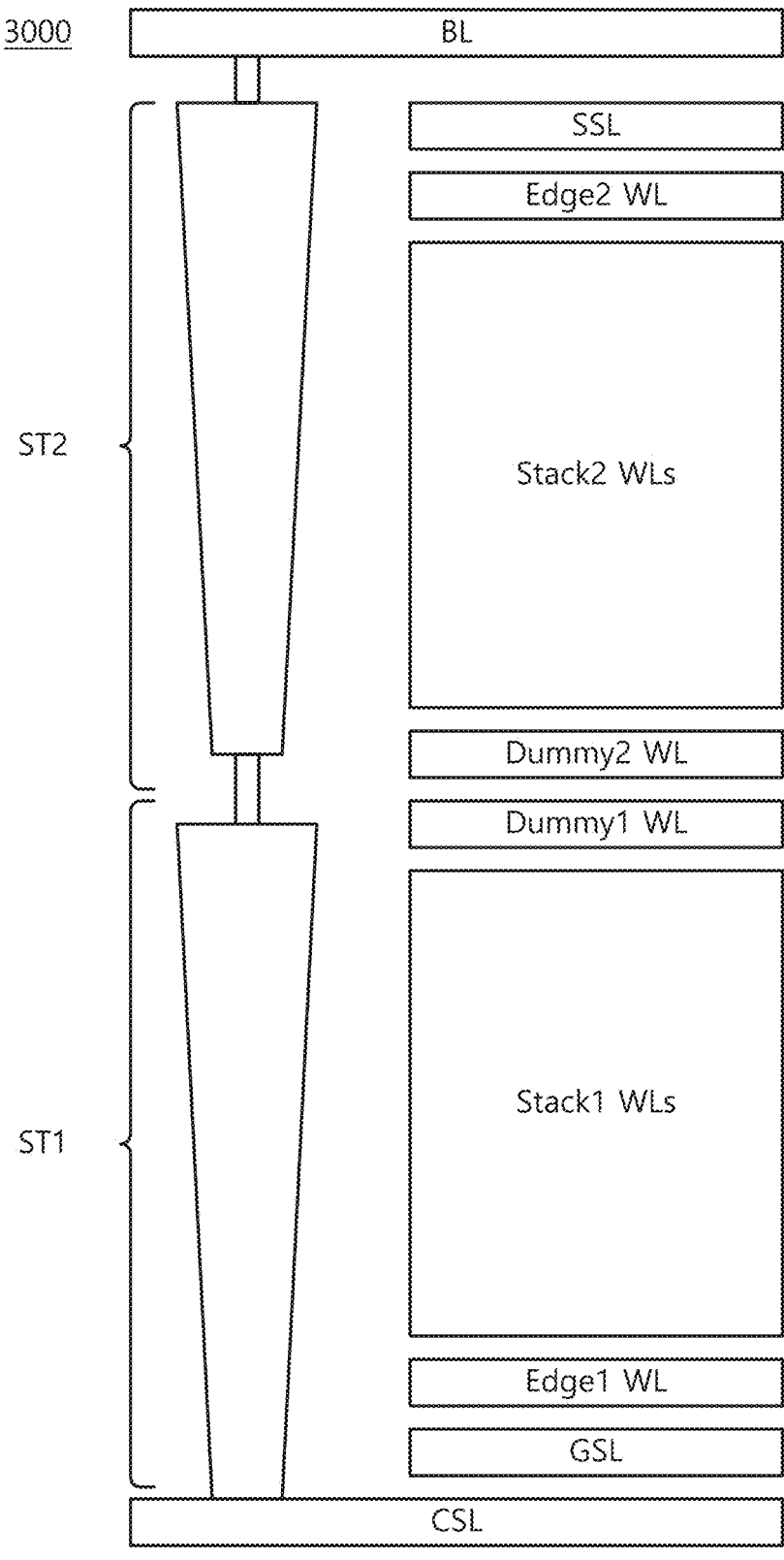
FIG. 20 is a diagram illustrating a flash memory having a multi-stack structure, according to some embodiments.

FIG. 20 is a diagram illustrating a flash memory having a multi-stack structure, according to some embodiments. Referring to FIG. 20, the flash memory 3000 may have a first stack ST1 and a second stack ST2. The first stack ST1 may be located at the bottom, and the second stack ST2 may be located at the top.

A pillar of the flash memory 3000 may be formed by bonding the first and second stacks ST1 and ST2. A plurality of dummy word lines (e.g., Dummy1 WL and Dummy2 WL) may be included at junctions of the first and second stacks ST1 and ST2. The first stack ST1 may be positioned between the common source line CSL and the first dummy word line Dummy1 WL. The second stack ST2 may be positioned between the second dummy word line Dummy2 WL and the bit line BL.

The first stack ST1 may include a ground selection line GSL, a first edge word line Edge1 WL, and first stack word lines Stack1 WLs. The second stack ST2 may include second stack word lines Stack2 WLs and second edge word lines Edge2 WL. Memory cells connected to the first and second edge word lines Edge1 WL and Edge2 WL may store bit data different from the other memory cells. For example, memory cells connected to the first and second edge word lines Edge1 WL and Edge2 WL may be SLC or MLC, and memory cells connected to the other word lines may be TCL or QLC.

The flash memory 3000 may control the number of memory blocks sharing the shared switch circuit differently depending on the height of the word line. For example, the flash memory 3000 may share the shared switch circuit within the same stack or between different stacks during a program or erase operation.

Figure 21:
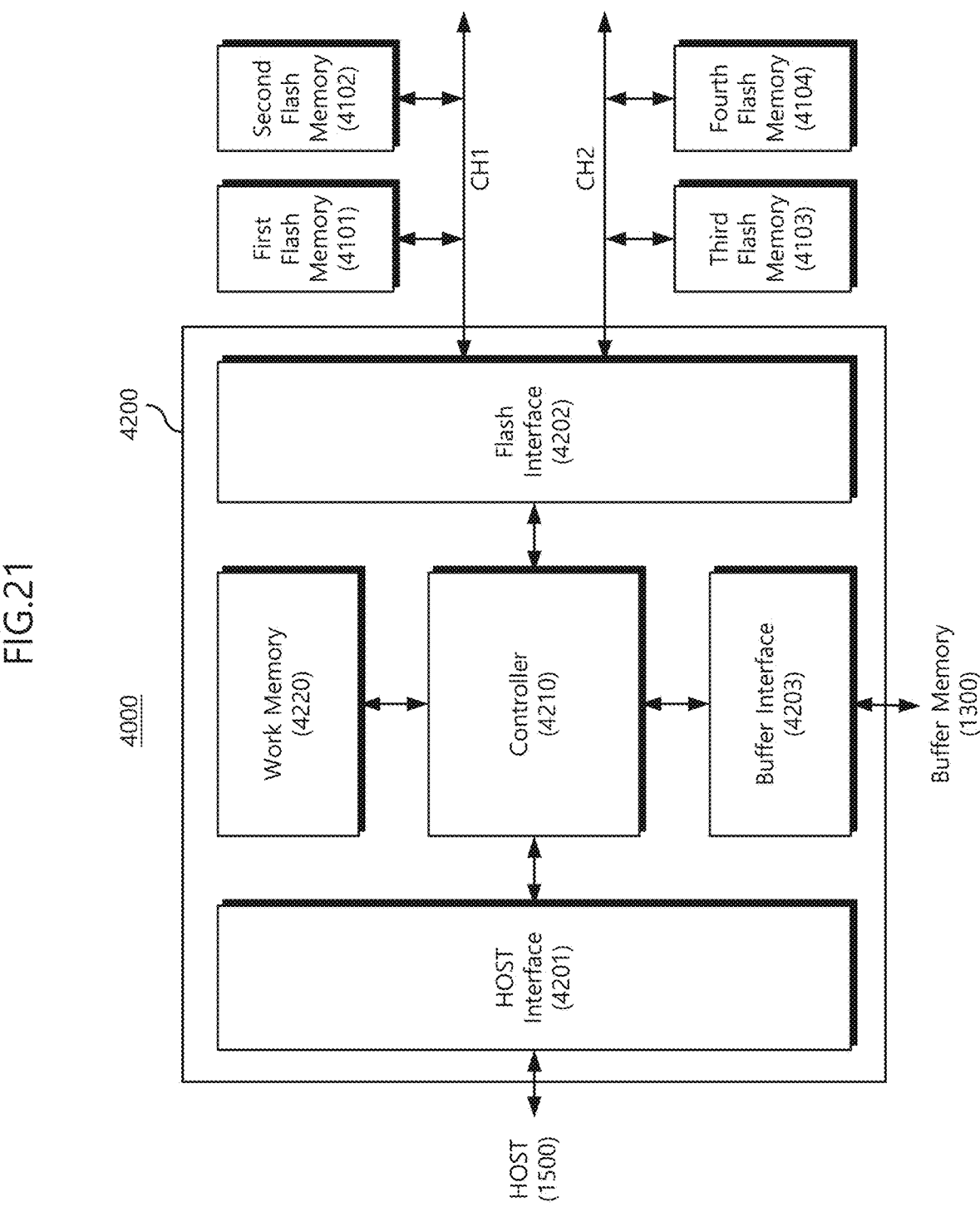
FIG. 21 is a block diagram illustrating an example in which a storage device according to an embodiment is implemented with a solid state drive (SSD).

FIG. 21 is a block diagram illustrating an example in which a storage device according to an embodiment is implemented with a solid state drive (SSD). Referring to FIG. 21, an SSD 4000 may include a plurality of flash memories, e.g., a first flash memory 4101, a second flash memory 4102, a third flash memory 4103, and a fourth flash memory 4104, and an SSD controller 4200.

The first and second flash memories 4101 and 4102 may be connected with the SSD controller 4200 through a first channel CH1. The third and fourth flash memories 4103 and 4104 may be connected with the SSD controller 4200 through a second channel CH2. The number of channels connected with the SSD controller 4200 may be 2 or more. The number of flash memories connected with one channel may be 2 or more.

The SSD controller 4200 may include a host interface 4201, a flash interface 4202, a buffer interface 4203, a controller 4210, and a work memory 4220. The SSD controller 4200 may be connected with a host 1500 through the host interface 4201. Depending on a request of the host 1500, the SSD controller 4200 may write data in the corresponding flash memory or may read data from the corresponding flash memory.

The SSD controller 4200 may be connected with the plurality of flash memories, e.g., the first to fourth flash memories 4101 to 4104, through the flash interface 4202 and may be connected with a buffer memory 1300 through the buffer interface 4203. The flash interface 4202 may provide data, which are temporarily stored in the buffer memory 1300, to the plurality of flash memories through the channels CH1 and CH2. The flash interface 4202 may transfer the data read from the first to fourth flash memories 4101 to 4104 to the buffer memory 1300.

The controller 4210 may analyze and process the signal received from the host 1500. The controller 4210 may control the host 1500 and/or the first to fourth flash memories 4101 to 4104 through the host interface 4201 and/or the flash interface 4202. The controller 4210 may control operations of the first to fourth flash memories 4101 to 4104 by using firmware for driving the SSD 4000.

The SSD controller 4200 may manage data to be stored in the first to fourth flash memories 4101 to 4104. In the sudden power-off event, the SSD controller 4200 may back up the data stored in the work memory 4220 and/or the buffer memory 1300 to the first to fourth flash memories 4101 to 4104. Here, the SSD controller 4200 may correspond to the memory controller 1200 and the first to fourth flash memories 4101 to 4104 to correspond to the memory device 1100, illustrated in FIG. 1.

According to various embodiments, it may be possible to reduce a test time taken to perform the margin read test operation and to perform the margin read test operation in high speed.

While the present disclosure has been described with reference to various embodiments thereof, it will be apparent to those of ordinary skill in the art that various changes and modifications may be made thereto without departing from the spirit and scope of the present disclosure as set forth in the following claims.

What is claimed is:

1. A flash memory comprising:
a memory block connected to a plurality of word lines;
an address decoder configured to provide a voltage to one or more of the plurality of word lines;
a first pass transistor connected to the address decoder;
a second pass transistor connected in series with the first pass transistor and connected between one word line among the plurality of word lines and the first pass transistor;
a first driver circuit comprising a depletion transistor and configured to control a gate voltage of the first pass transistor based on a first enable signal; and
a second driver circuit comprising another depletion transistor and configured to control a gate voltage of the second pass transistor based on a second enable signal,
wherein based on the memory block being an unselected memory block during an erase operation, the first driver circuit controls the first pass transistor to be in a floating state, and the second driver circuit controls a power voltage to be provided to a gate of the second pass transistor.

2. The flash memory of claim 1, further comprising:
a first switch circuit configured to selectively provide a first power voltage or a second power voltage to a gate of the first pass transistor through the first driver circuit based on a first switch signal; and
a second switch circuit configured to selectively provide the first power voltage or the second power voltage to the gate of the second pass transistor through the second driver circuit based on a second switch signal.

3. The flash memory of claim 2, wherein based on the memory block being a selected memory block during the erase operation, the first driver circuit is configured to provide the first power voltage to the gate of the first pass transistor, and the second driver circuit is configured to selectively provide the first power voltage or the second power voltage to the gate of the second pass transistor.

4. The flash memory of claim 2, wherein based on the memory block being a selected memory block during a program operation, the first driver circuit is configured to provide the first power voltage to the gate of the first pass transistor, and the second driver circuit is configured to provide the first power voltage to the gate of the second pass transistor.

5. The flash memory of claim 2, wherein based on the memory block being the unselected memory block during a program operation, the first driver circuit is configured to provide the second power voltage to the gate of the first pass transistor, and the second driver circuit controls the second pass transistor to be in a floating state.

6. The flash memory of claim 2, wherein: the first switch signal and the second switch signal are generated using a block address, based on the memory block being a selected memory block, the first switch signal is configured to select the first power voltage, and based on the memory block being the unselected memory block, the second switch signal is configured to select the second power voltage.

7. The flash memory of claim 2, wherein: the first enable signal and the second enable signal are generated using a block address and an operation signal, based on the memory block being a selected memory block, the first enable signal is configured to provide the first power voltage both to the gate of the first pass transistor and to the gate of the second pass transistor.

8. The flash memory of claim 7, wherein, based on the memory block being the unselected memory block during a program operation, the first enable signal is configured to provide the second power voltage to the gate of the first pass transistor, and
wherein the second enable signal causes the second pass transistor to be in a floating state.

9. The flash memory of claim 7, wherein, based on the memory block being the unselected memory block during the erase operation, the first enable signal causes the first pass transistor to be in a floating state, and the second enable signal causes the second power voltage to be provided to the gate of the second pass transistor.

10. The flash memory of claim 2, wherein a selection memory block and an unselected memory block share the second switch circuit.

11. A flash memory comprising:
a memory block connected to a plurality of word lines;
an address decoder configured to select the memory block using a block address;
a first pass transistor connected to the address decoder;
a second pass transistor connected in series with the first pass transistor and connected to a word line among the plurality of word lines;
a first driver circuit configured to control a gate voltage of the first pass transistor based on a first enable signal;
a second driver circuit configured to control a gate voltage of the second pass transistor based on a second enable signal;
a first switch circuit configured to selectively provide a first power voltage or a second power voltage to a gate of the first pass transistor through the first driver circuit based on a first switch signal; and
a second switch circuit configured to selectively provide the first power voltage or the second power voltage to a gate of the second pass transistor through the second driver circuit based on a second switch signal,
wherein the first switch circuit is used individually for the memory block, and
wherein the second switch circuit is shared by the memory block and other memory blocks.

12. The flash memory of claim 11, wherein, based on the memory block being a selected memory block during an erase operation, the first driver circuit causes the first power voltage to be provided to the gate of the first pass transistor, and the second driver circuit is configured to provide the second power voltage to the gate of the second pass transistor, the second power voltage being lower than the first power voltage.

13. The flash memory of claim 12, wherein, based on the memory block being an unselected memory block during the erase operation, the first driver circuit causes the first pass transistor to be in a floating state, and the second driver circuit is configured to provide the second power voltage to the gate of the second pass transistor.

14. The flash memory of claim 11, wherein, based on the memory block being an unselected memory block during a program operation, the first driver circuit causes the second power voltage to be provided to the gate of the first pass transistor, and the second driver circuit controls the second pass transistor to be in a floating state.

15. The flash memory of claim 14, wherein, based on the memory block being a selected memory block during the program operation, the first driver circuit causes the first power voltage to be provided to the gate of the first pass transistor, and the second driver circuit is configured to provide the first power voltage to the gate of the second pass transistor.

16. A block selection circuit of a flash memory, the block selection circuit comprising:

a first pass transistor connected to an address decoder;

a second pass transistor connected in series with the first pass transistor, and is connected between the first pass transistor and a memory block;

a first driver circuit comprising a depletion transistor and configured to control a gate voltage of the first pass transistor based on a first enable signal; and a second driver circuit comprising another depletion transistor and configured to control a gate voltage of the second pass transistor based on a second enable signal, wherein, based on the memory block connected to the second pass transistor during an erase operation being an unselected memory block, the first driver circuit controls the first pass transistor to be in a floating state, and the second driver circuit controls a power voltage to be provided to a gate of the second pass transistor.

17. The block selection circuit of claim 16, further comprising:

a first switch circuit configured to selectively provide a first power voltage or a second power voltage to a gate of the first pass transistor through the first driver circuit based on a first switch signal, the second power voltage being lower than the first power voltage; and a second switch circuit configured to selectively provide the first power voltage or the second power voltage to the gate of the second pass transistor through the second driver circuit based on a second switch signal.

18. The block selection circuit of claim 17, wherein, based on the memory block being a selected memory block during the erase operation, the first driver circuit causes the first power voltage to be provided to the gate of the first pass transistor, and the second driver circuit is configured to provide the second power voltage to the gate of the second pass transistor.

19. The block selection circuit of claim 17, wherein, based on the memory block being the unselected memory block during a program operation, the first driver circuit causes the second power voltage to be provided to the gate of the first pass transistor, and the second driver circuit controls the second pass transistor to be in a floating state.

20. The block selection circuit of claim 17, wherein the first switch circuit is used individually for each memory block, the second switch circuit is shared by the memory block and other memory blocks.

* * * * *